United States Patent
Okai et al.

(10) Patent No.: US 11,852,599 B2
(45) Date of Patent: Dec. 26, 2023

(54) IMAGE PROCESSING SYSTEM

(71) Applicant: Hitachi High-Tech Corporation, Tokyo (JP)

(72) Inventors: Nobuhiro Okai, Tokyo (JP); Naomasa Suzuki, Tokyo (JP); Muneyuki Fukuda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 407 days.

(21) Appl. No.: 17/382,515

(22) Filed: Jul. 22, 2021

(65) Prior Publication Data
US 2022/0042936 A1 Feb. 10, 2022

(30) Foreign Application Priority Data
Aug. 5, 2020 (JP) ................................. 2020-132779

(51) Int. Cl.
| | | |
|---|---|---|
| G01N 23/2251 | (2018.01) | |
| G06T 7/62 | (2017.01) | |
| G06T 7/50 | (2017.01) | |
| G06N 3/04 | (2023.01) | |
| H01J 37/22 | (2006.01) | |

(52) U.S. Cl.
CPC .......... *G01N 23/2251* (2013.01); *G06N 3/04* (2013.01); *G06T 7/50* (2017.01); *G06T 7/62* (2017.01); *H01J 37/222* (2013.01); *G01N 2223/6116* (2013.01); *G06T 2207/10061* (2013.01); *G06T 2207/30148* (2013.01)

(58) Field of Classification Search
CPC ......... G01N 23/2251; G06T 7/50; G06T 7/62; G06T 3/04; G06T 2207/30148; G06T 2207/10061; H01J 37/222
See application file for complete search history.

(56) References Cited

U.S. PATENT DOCUMENTS

| | | | |
|---|---|---|---|
| 2007/0187595 A1* | 8/2007 | Tanaka | G01N 23/2251 250/307 |
| 2007/0198955 A1* | 8/2007 | Nagatomo | G06V 20/588 716/100 |
| 2019/0148108 A1* | 5/2019 | Sun | H01J 37/244 250/307 |

FOREIGN PATENT DOCUMENTS

| | | |
|---|---|---|
| JP | 2007218711 A | 8/2007 |
| JP | 2007227618 A | 9/2007 |
| KR | 10-2019-0053771 A | 5/2019 |
| KR | 10-2020-0017445 A | 2/2020 |

(Continued)

OTHER PUBLICATIONS

Office Action dated Dec. 20, 2022 in Korean Application No. 10-2021-0064542.

*Primary Examiner* — David E Smith
(74) *Attorney, Agent, or Firm* — Miles & Stockbridge, P.C.

(57) ABSTRACT

Provided is an image processing system capable of estimating a three-dimensional shape of a semiconductor pattern or a particle by solving problems of measurement reduction in a height direction and taking an enormous amount of time at a time of acquiring learning data. The image processing system according to the disclosure stores a detectable range of a detector provided in a charged particle beam device in a storage device in advance, generates a simulated image of a three-dimensional shape pattern using the detectable range, and learns a relationship between the simulated image and the three-dimensional shape pattern in advance.

15 Claims, 46 Drawing Sheets

(56) References Cited

FOREIGN PATENT DOCUMENTS

WO 2020166076 A1 8/2020

\* cited by examiner

FIG. 37

```
Number of Detectors 2
Landing energy 1000
BSE
Energy Step 100
Elevation Angle Step 5
Azimuth Angle Step 15

Energy   Elevation   Azimuth   Det1   Det2
100      0           0         0.0    0.0
                     .
                     .
500      45          75        0.8    0.0
500      45          90        1.0    0.0
500      45          105       0.8    0.0
                     .
                     .
500      45          255       0.0    0.8
500      45          270       0.0    1.0
500      45          285       0.0    0.8
                     .
                     .
                     .
                     .
```

IMAGE PROCESSING SYSTEM

CROSS-REFERENCE TO RELATED APPLICATION

This application claims the priority of Japanese Patent Application No. 2020-132779 filed Aug. 5, 2020, which is incorporated herein by reference in its entirety.

BACKGROUND OF THE DISCLOSURE

1. Field of the Invention

The present disclosure relates to an image processing system that estimates a three-dimensional shape of a sample based on a measurement image of the sample acquired by a charged particle beam device.

2. Description of the Related Art

In a fabrication process of a semiconductor device, it is necessary to evaluate a three-dimensional shape such as a height or a taper angle of a fabricated semiconductor pattern or a height of a particle adhering to a semiconductor wafer. If the semiconductor pattern is not fabricated as designed, a problem occurs in that desired device performance cannot be attained. If the particle adheres to the wafer, the particle may affect the subsequent fabrication process depending on a size of the particle. Therefore, it is required to quantitatively evaluate the three-dimensional shape of the semiconductor pattern or the particle on the semiconductor wafer.

An example of a device that observes a fine object with high resolution is a scanning electron microscope (SEM). In particular, as the SEM for a purpose of observing or measuring the semiconductor pattern or the particle on the semiconductor wafer, a critical dimension-SEM (CD-SEM) measuring the pattern width and a defect review SEM are commercialized.

A method is known that measures a three-dimensional shape of a semiconductor pattern on a wafer based on a signal profile or an SEM image obtained by scanning an electron beam. JP-A-2007-218711 (PTL 1) discloses a method of estimating a shape of a target pattern by performing electron beam simulation reflecting device characteristics and image acquisition conditions for various target pattern shapes in advance, by creating an SEM simulated profile and recording the SEM simulated profile as a library, by comparing an actual SEM image acquired based on a pattern to be measured with the SEM simulated profile, and by selecting a profile having a highest degree of coincidence. JP-A-2007-227618 (PTL 2) discloses a method of associating image feature amounts extracted from actual SEM images of various patterns and cross-sectional shapes of patterns acquired using a measurement tool other than the SEM such as an atomic force microscope (AFM) with each other, storing the image feature amounts and the cross-sectional shapes in advance as learning data in a database, and comparing the image feature amounts extracted from the actual SEM images of patterns to be measured with the learning data, thereby estimating the cross-sectional shapes.

SUMMARY OF THE DISCLOSURE

As described in the Related Art, in the fabrication process of the semiconductor device, it is required to measure the three-dimensional shape of the semiconductor pattern and the particle in order to improve a production yield and to stably operate the fabrication process. When the fabricated semiconductor pattern has a shape different from the design, expected device performance cannot be attained, which leads to a decrease in the production yield. Therefore, an error generation factor is elucidated based on an error between the three-dimensional shape measured by the user and the design shape, and the elucidated error generation factor is fed back to the fabrication process of the semiconductor device. It is known that, when the particle having a height larger than a predetermined height, a distance between the particle and an upper layer becomes short, and the particle affects electric performance such as a breakdown voltage of the semiconductor device. Therefore, based on the three-dimensional shape of the particle and material information determined by energy dispersive X-ray spectroscopy (EDS, EDX), feedback is provided to estimate a particle generation factor and to determine improvement of fabrication process conditions and necessity of cleaning a film forming and processing device.

PTL 1 discloses a method of estimating a cross-sectional shape of a semiconductor pattern by preparing a library in advance. However, in PTL 1, since the cross-sectional shape is estimated using one top-down SEM image obtained by observing a sample from above without inclining the sample, it may be required to acquire more information on a height.

PTL 2 discloses a method of using, as learning data, an image feature amount extracted from an actual SEM image and a cross-sectional shape of a pattern acquired by a device (for example, an AFM or a cross-sectional SEM) other than the SEM. However, in the AFM and the cross-sectional SEM, it is difficult to acquire data at the same position as the SEM, and higher measurement accuracy may be required for a steep slope. Further, time required for the measurement tends to be longer than that of the SEM.

This disclosure provides an image processing system capable of estimating a three-dimensional shape of a semiconductor pattern or a particle by solving the problems of necessity for more information in a height direction and taking an enormous amount of time when of acquiring learning data.

An image processing system according to the disclosure stores, in a storage device, a detectable range of a detector provided in a charged particle beam device in advance, generates a simulated image of a three-dimensional shape pattern using the detectable range, and learns a relationship between the simulated image and the three-dimensional shape pattern in advance.

According to the image processing system according to the disclosure, it is possible to estimate the three-dimensional shape of the semiconductor pattern or the particle with high accuracy without requiring an enormous amount of time to acquire the learning data.

BRIEF DESCRIPTION OF THE DRAWINGS

FIG. 37 shows an example in which detection acceptance is input in a form of a text file.

DESCRIPTION OF THE PREFERRED EMBODIMENTS

First Embodiment

In a first embodiment according to the disclosure, for a structure (in a case of a semiconductor wafer, a convex pattern such as a line or a dot, a concave pattern such as a hole or a trench, or the like) formed on a sample, or for a particle placed on the sample (semiconductor wafer), or the like, a height map of a region of an image is estimated based on an SEM image acquired in a region including the structure, the particle, or the like.

Figure 1:
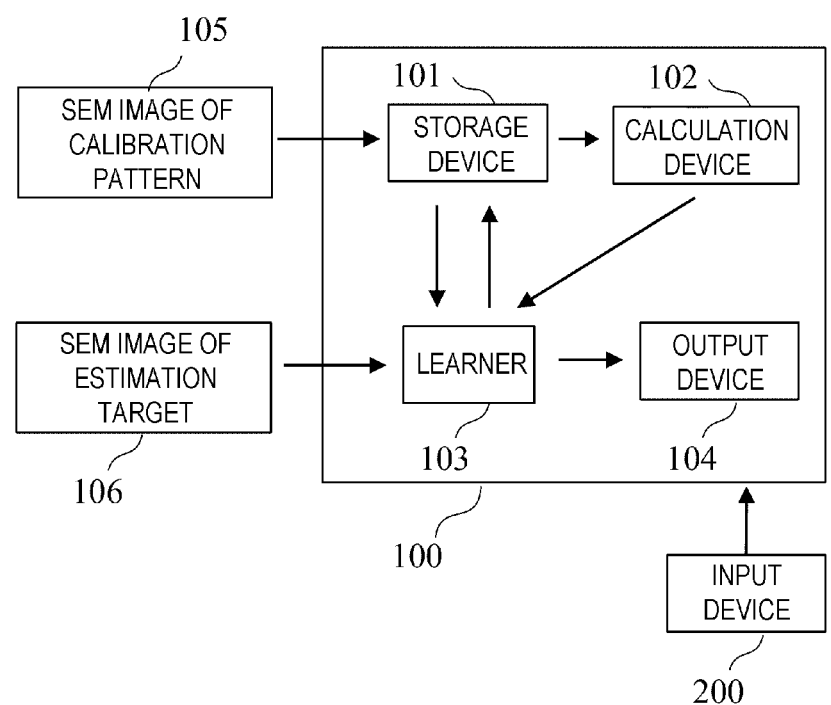
FIG. 1 is a configuration diagram showing an image processing system 100 according to a first embodiment.

FIG. 1 is a configuration diagram showing an image processing system 100 according to the first embodiment of the disclosure. The image processing system 100 includes a storage device 101, a calculation device (processor) 102, a learner 103, an output device 104, and an input device 200. The output device 104 is a device that outputs a processing result obtained by the image processing system 100. The output device 100 can be, for example, a display or a data output device. The input device 200 is an interface used by a user to give an instruction to the image processing system 100. The output device 104 and the input device 200 may be a part of the image processing system 100, or may be devices different from the image processing system 100.

The image processing system 100 outputs a height distribution (hereinafter, referred to as a height map) of an image region by inputting an SEM image including a structure to be estimated to the learner 103 (learning model), and estimates a three-dimensional shape such as a height or a taper angle of the structure by analyzing the height map.

An SEM image 105 of a pattern (hereinafter, referred to as a calibration pattern) having a known three-dimensional shape is stored in the storage device 101. The SEM image 105 is acquired using a scanning electron microscope. The calculation device 102 creates simulated SEM images corresponding to various shapes by simulation based on the SEM image 105 of the calibration pattern stored in the storage device 101. The learner 103 learns, as training data, data including a set of various shapes created by the calculation device 102 and a simulated SEM image having the various shapes. The output device 104 outputs the height map obtained from the learner 103 by inputting an SEM image 106 of the estimation target to the learner 103. Learned model data can be stored in the storage device 101, and the learned model data can be read from the storage device 101.

Figure 2:
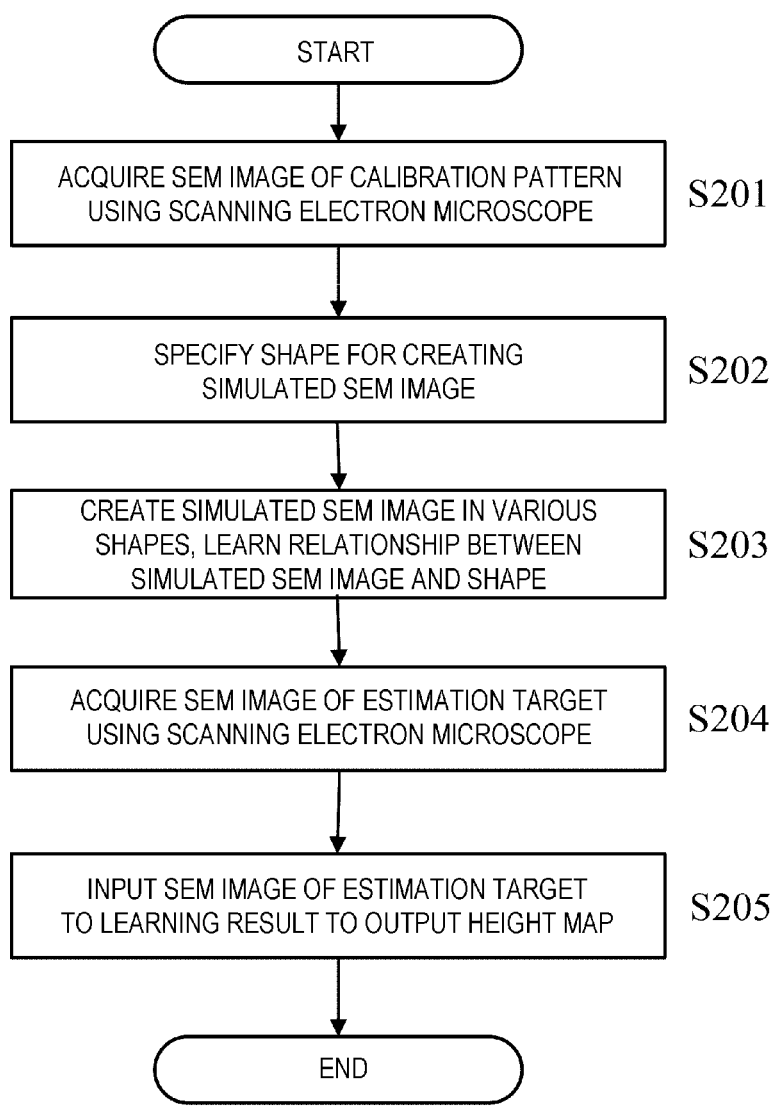
FIG. 2 is a flowchart showing processing of the image processing system 100 estimating a height map.

FIG. 2 is a flowchart showing processing of the image processing system 100 estimating the height map. The present flowchart is implemented by the storage device 101, the calculation device 102, the learner 103, the output device 104, and the input device 200. The same applies to flowcharts to be described later. The SEM image 105 of the calibration pattern is acquired using the scanning electron microscope and is stored in the storage device 101 (S201). Using the input device 200, a shape for creating the simulated SEM image is specified or selected (S202). The calculation device 102 creates the simulated SEM image in various shapes set in S202 based on the SEM image 105 of the calibration pattern stored in the storage device 101, and the learner 103 learns a relationship between the simulated SEM image and the shape (S203). The SEM image 106 of the estimation target is acquired using the scanning electron microscope (S204). The learner 103 inputs the SEM image in S204 to the learner 103 to estimate a three-dimensional shape of the pattern of the estimation target or the particle, and outputs the estimated three-dimensional shape to the output device 104 (S205).

Figure 3:
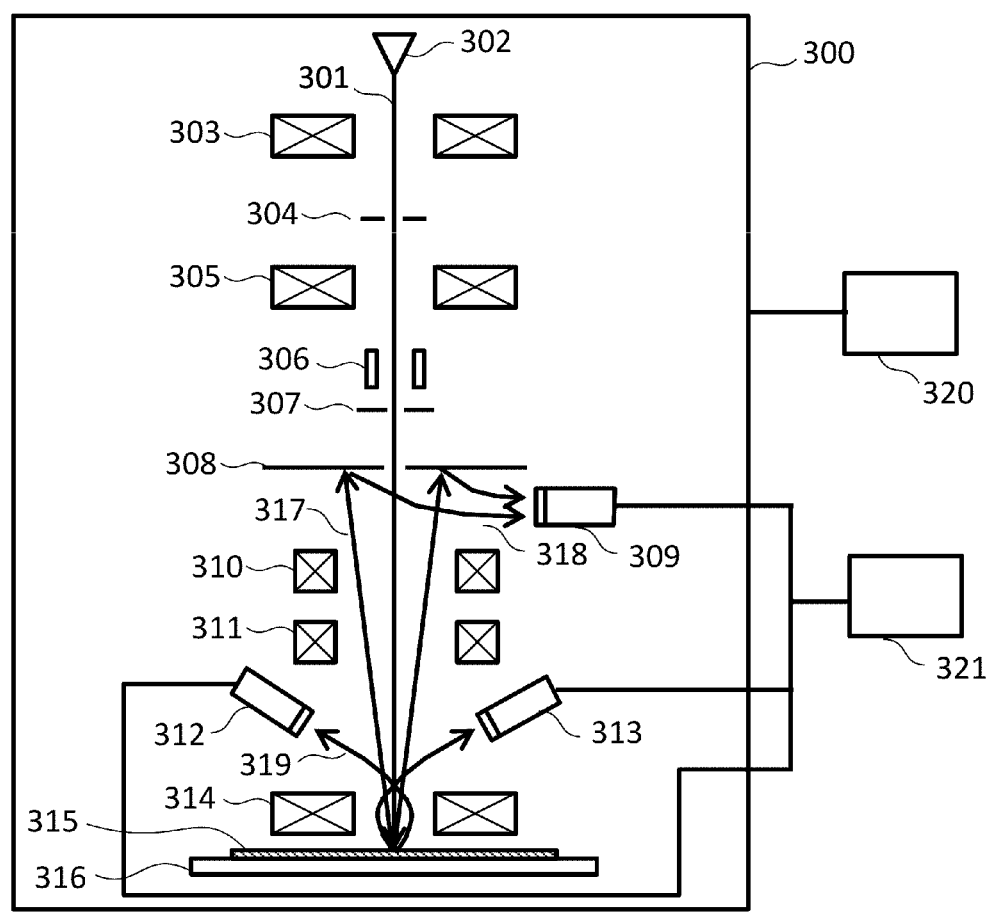
FIG. 3 is a diagram showing a configuration example of a scanning electron microscope 300.

FIG. 3 is a diagram showing a configuration example of the scanning electron microscope 300. The scanning electron microscope 300 is used to acquire the SEM image 105 of the calibration pattern and the SEM image 106 of the estimation target. The scanning electron microscope 300 includes an electron gun 302 that emits an electron beam 301, a focusing lens 303 that focuses the electron beam 301, and a focusing lens 305 that further focuses the electron beam 301 passing through the focusing lens 303. A diaphragm 304 is provided immediately below the focusing lens 303, and a probe current passing through the diaphragm 304 is changed by strength of the focusing lens 303, so that the probe current applied to a sample 315 can be controlled. The scanning electron microscope 300 further includes an upper scanning deflector 310 and a lower scanning deflector 311 that deflect the electron beam 301, and an objective lens 314 that controls a height of focus of the electron beam 301. A deflection direction and intensity of the upper scanning deflector 310 and the lower scanning deflector 311 are adjusted so that the scanned electron beam 301 always passes through a center of the objective lens 314. The scanning electron microscope 300 further includes a blanking deflector 306 that limits the electron beam 301 from reaching a sample 315 by deflecting the electron beam 301 out of an optical axis, and a blanking electrode 307 that receives the electron beam 301 deflected by the blanking deflector 306. Optical components and a sample stage 316 are controlled by a control device 320, and an SEM image can be acquired under observation conditions (a beam energy, a probe current, an observation position, and the like) specified by the user.

The sample 315 placed on the sample stage 316 is irradiated with the electron beam 301. Secondary particles are emitted from the sample 315 by irradiation with the electron beam 301. In general, emitted electrons having a low energy of 50 eV or less are referred to as secondary electrons (SEs). Emitted electrons having a high energy of 50 eV or more are referred to as backscattered electrons (BSEs). Hereinafter, in the disclosure, the secondary electrons and reflected electrons are collectively referred to as secondary particles.

Among the secondary particles emitted from the sample, secondary particles 317 emitted in a direction forming a large angle with respect to a surface of the sample 315 pass through substantially the same trajectory as the electron beam (301) and collide with the diaphragm 308. In the diaphragm 308, secondary particles 318 are generated again by collision of the secondary particles 317. The generated secondary particles 318 are detected by the upper detector 309 provided closer to a sample side than the diaphragm 308.

Secondary particles 319 emitted in a direction forming a small angle with respect to the surface of the sample 315 are emitted in a direction away from the optical axis (on the trajectory of the electron beam 301), are then pulled back to an optical axis side by a leakage magnetic field of the objective lens 314, pass through the objective lens 314, and are detected by the lower detectors 312 and 313 provided at positions away from the optical axis. In FIG. 3, the two lower detectors are provided symmetrically with respect to the optical axis of a primary electron beam. The detector may be a three-direction detector provided at a position rotated every 120°, a four-direction detector with two more detectors provided in a paper-perpendicular direction, or a plurality of detectors with more detectors provided. The secondary particles that reach the upper detector 309 and the lower detectors 312 and 313 become luminance modulation input signals synchronized with scanning deflection, are processed as the SEM image, and are stored in a recording device 321.

Figure 4A:
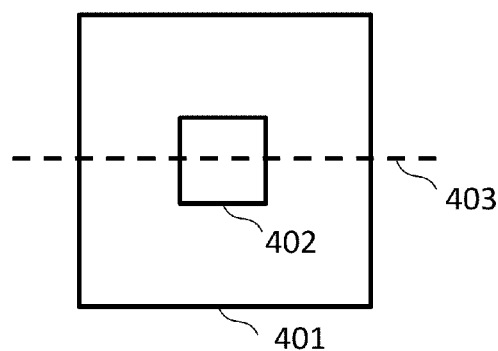
FIG. 4A shows a height distribution of a dot pattern.
Figure 4B:
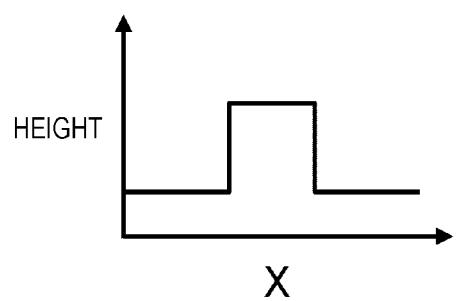
FIG. 4B shows a one-dimensional height distribution of the dot pattern in FIG. 4A in an X direction.
Figure 4C:
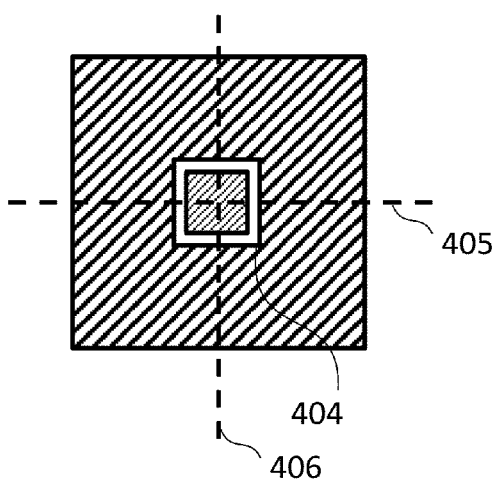
FIG. 4C is a schematic view showing an SEM image when the dot pattern is observed using an upper detector 309.
Figure 4D:
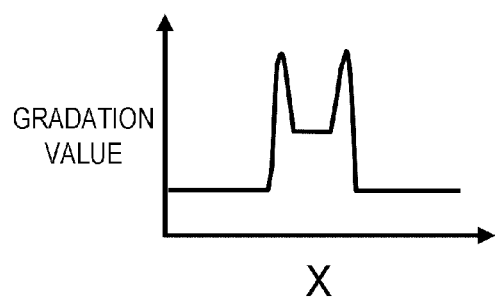
FIG. 4D is a one-dimensional gradation value profile of the SEM image in FIG. 4C in the X direction.
Figure 4E:
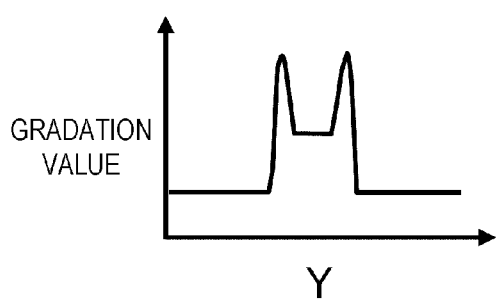
FIG. 4E is a one-dimensional gradation value profile of the SEM image in FIG. 4C in a Y direction.

FIGS. 4A to 4E are schematic views showing a shape of the dot pattern and the SEM images when the dot pattern is observed using the upper detector 309. In the configuration in FIG. 3, in general, the upper detector detects the secondary electrons having a low energy. In order to simplify the description, inclination (taper angle) of an edge of the dot pattern is set to 90°. FIG. 4A shows a top view when a dot pattern 402 is provided at a center of an observation field 401 (field-of-view: FOV). FIG. 4B shows the height along a broken line 403 in FIG. 4A. A dot portion has a high distribution. Next, FIG. 4C shows the SEM image acquired by the upper detector 309 in FIG. 3. FIGS. 4D and 4E respectively show results of plotting gradation values of the SEM image along broken lines 405 and 406 in FIG. 4C. A bright portion 404 (referred to as a white band) due to an edge effect is observed at an edge portion in all azimuths of the dot pattern. That is, since the images are viewed in the same manner in all azimuths, an SEM image having no azimuthal property can be obtained.

Figure 5A:
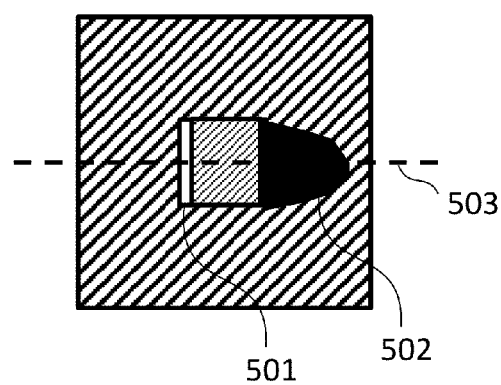
FIG. 5A is a schematic view showing an SEM image when the dot pattern in FIG. 4A is observed using a lower detector 312.
Figure 5B:
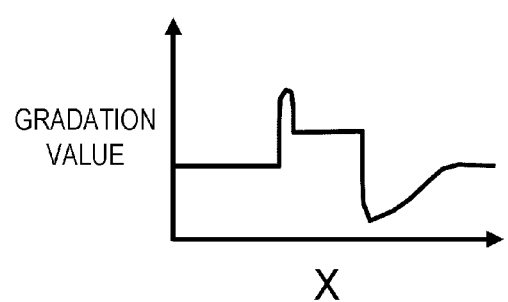
FIG. 5B is a one-dimensional gradation value profile of the SEM image in FIG. 5A in the X direction.
Figure 5C:
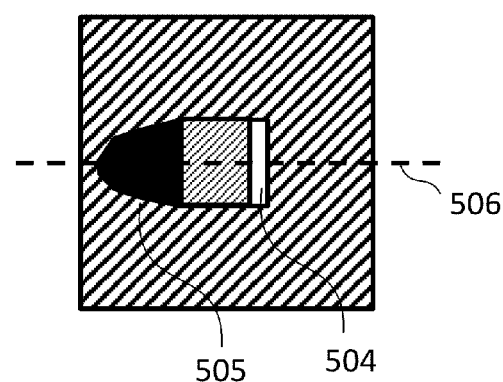
FIG. 5C is a schematic view showing an SEM image when the dot pattern in FIG. 4A is observed using a lower detector 313.
Figure 5D:
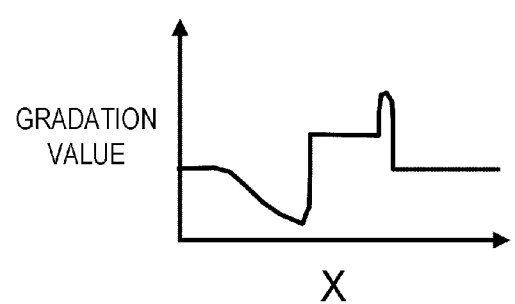
FIG. 5D is a one-dimensional gradation value profile of the SEM image in FIG. 5C in the X direction.

FIGS. 5A to 5D show schematic views of the SEM image when the dot pattern in FIG. 4A is observed by the lower detectors 312 and 313. In the configuration in FIG. 3, in general, the lower detector detects the backscattered electrons having a high energy. FIG. 5A shows the SEM image acquired using the lower detector 312. FIG. 5B shows a result of plotting the gradation values of the SEM image along a broken line 503 in FIG. 5A. The detector is provided on a left side with respect to the SEM image. The white band is observed only on a left edge of the dot pattern corresponding to a detector side. A dark shadow (called shadow) is observed on a flat portion on a right side of the dot pattern. FIG. 5C shows the SEM image acquired using the lower detector 313. FIG. 5D shows a result of plotting the gradation values of the SEM image along a broken line 506 in FIG. 5C. In these SEM images, contrary to FIG. 5A, the white band is observed only in a right edge of the dot pattern. The shadow is observed in the flat portion on the left side of the dot pattern.

The shadow is generated when the secondary particles generated by irradiating the flat portion near the dot pattern with the electron beam do not reach the detector due to the dot pattern serving as an obstacle. That is, when the image is acquired by the detector provided on the left side, if the shadow protrudes to the right side of the pattern, the shadow has a protruding shape. Conversely, if the shadow protrudes to the left side of the pattern, the shadow has a recessed shape. Due to such a feature of the SEM image, a plurality of lower detectors arranged symmetrically with respect to the optical axis are utilized for determining unevenness of the pattern of an observed object. A length of the shadow depends on the height of the dot pattern. The higher the pattern is, the longer the shadow becomes. That is, the height of the pattern can be estimated by utilizing the shadow.

An attempt to estimate the three-dimensional shape using the SEM images acquired using a plurality of detectors has been made for a long time. The plurality of detectors is provided symmetrically with respect to the optical axis in such attempts. A most common method is a Shape-From-Shading method (a restoration method based on a shade). This method reconstructs the shape on an assumption that a shade (dark portion) in an image is caused by a change in luminance due to a light source direction and a normal direction of a surface. This method calculates a three-dimensional inclination of each pixel by calculating signals of detectors provided at different positions, and integrates the calculated three-dimensional inclination to convert the calculated three-dimensional inclination into a relative height of a sample surface. Specifically, the height map of the sample is created by integrating, along an axis passing through the two detectors, a difference between the gradation values of the images acquired using the detectors provided symmetrically.

Figure 6A:
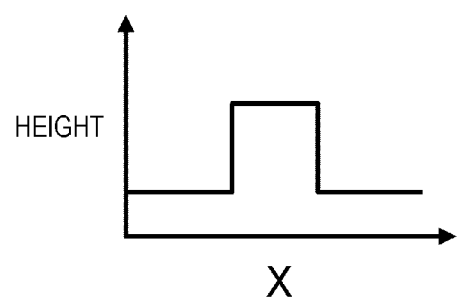
FIG. 6A shows a one-dimensional height distribution of the dot pattern in FIG. 4A in the X direction.
Figure 6B:
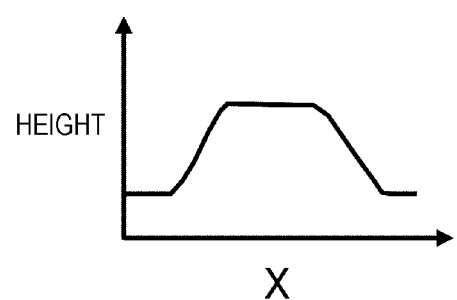
FIG. 6B shows a one-dimensional height distribution in the X direction when a height map is created based on a shape from shading method using two SEM images (FIGS. 5A and 5C) acquired by the lower detectors 312 and 313 for the dot pattern shown in FIG. 4A.

FIGS. 6A and 6B show the results of creating the height map based on the Shape-From-Shading method using two SEM images (FIGS. 5A and 5C) acquired using the lower detectors 312 and 313 for the dot pattern shown in FIG. 4A. FIG. 6B shows an example of the height map according to the Shape-From-Shading method. FIG. 6A shows an actual height map of the dot pattern for comparison. Here, for the sake of simplicity, a one-dimensional height distribution is shown. As a result, a slope becomes gentler than the actual shape (FIG. 6A). As described above, in a case of an object having a steep slope, a shadow is formed near the object. The shadow is caused by the light from the light source being blocked by the object, and is a phenomenon that is different from the shade in the principle of formation and is not considered in the Shape-From-Shading method, which causes a reduction in accuracy at a time of reconstruction.

Further, in the SEM, the white band due to the edge effect and the reflection on an object surface are observed, which further causes the reduction in the accuracy. Further, as a fundamental problem, in this method, since the height map is reconstructed based on the gradation value of the image, an absolute value of the height cannot be obtained correctly.

The difference in the appearance of the images acquired by the upper detector 309 and the lower detectors 312 and 313 in FIG. 3 can be described by energy and an angle of the secondary particles detected by the detectors. Here, the energy and an angular range of the secondary particles detected by the detectors are represented in a table or a drawing, which is referred to as detection acceptance. That is, the detection acceptance represents a range in which the detectors can detect the secondary particles. Here, the detection acceptance varies not only depending on the arrangement of the detector but also depending on optical conditions such as an irradiation energy or an electrode voltage. It is a matter of course that different detectors may acquire different SEM images which respectively have different appearances from each other. Even if a same detector is used, the SEM images having different appearances can be obtained under different optical conditions. Therefore, for the SEM image of the calibration pattern and the SEM image of the pattern of the estimation target, it is essential to match not only the detector but also the optical conditions. In the following, in order to simplify the description, the detection acceptance will be described by a two-dimensional table including an elevation angle and an azimuth angle.

Figure 7A:
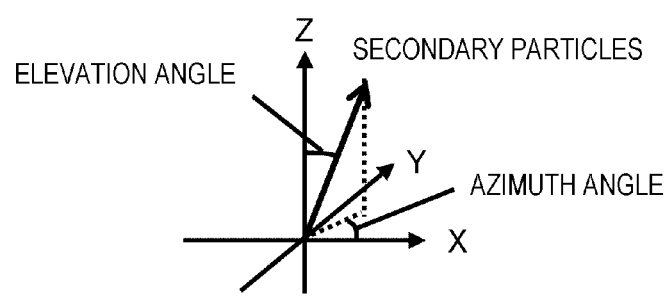
FIG. 7A shows a coordinate system of an elevation angle and an azimuth angle.

FIG. 7A shows a coordinate system of the elevation angle and the azimuth angle. The elevation angle is represented by an inclination from a Z axis. The azimuth angle represents a counterclockwise rotation angle from an X axis.

Figure 7B:
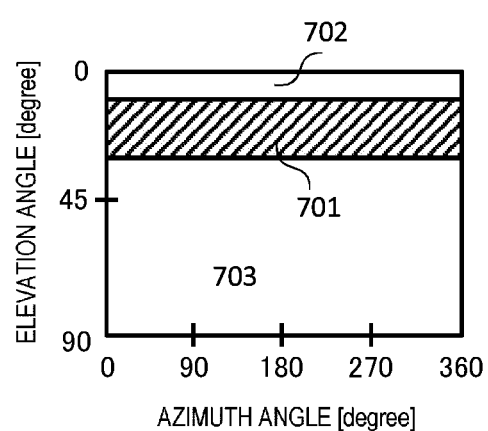
FIG. 7B shows an example of detection acceptance of the upper detector 309 in which a vertical axis represents the elevation angle and a horizontal axis represents the azimuth angle.

FIG. 7B shows an example of the detection acceptance of the upper detector 309 in which a vertical axis represents the elevation angle and a horizontal axis represents the azimuth angle. A region 701 surrounded by diagonal lines is a detectable angular range of the secondary particles. Regions 702 and 703 other than the region 701 are undetectable angular ranges of the secondary particles. Based on the detection acceptance, it can be seen that the upper detector 309 can detect the secondary particles having an elevation angle of 10° to 30° and all the azimuth angle of 0° to 360°. When all azimuths can be detected as in this figure, the SEM image has no azimuthal property. As shown in FIG. 4C, the white band is similarly observed at the edges of all azimuths of the dot pattern. The elevation angle serving as a boundary between the undetectable region 701 and the detectable region 702 is mainly determined by a hole diameter of the diaphragm 308. The elevation angle serving as the boundary between the detectable region 702 and the undetectable region 703 is determined by the energy of the secondary particles, a distance to the detector, and the like. In a case of secondary electrons having a low energy of the secondary particles, most of the secondary electrons are pulled up and detected. Therefore, the range of the detectable elevation angle is approximately from several degrees to 90°.

Figure 7C:
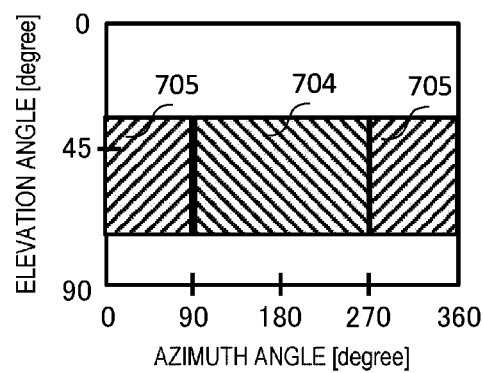
FIG. 7C shows an example of the detection acceptance of the lower detectors 312 and 313.

FIG. 7C shows an example of the detection acceptance of the lower detectors 312 and 313. As in FIG. 7B, regions 704 and 705 surrounded by the diagonal lines are detectable angular ranges. The region 704 corresponds to the lower detector 312. The region 705 corresponds to the lower detector 313. The reason why the two detectors have the same detectable elevation angle range is that the two detectors are provided symmetrically with respect to the optical axis at the same height. Focusing on the azimuth angle, the two detectors are symmetrically divided, and each detects an azimuth angle component in the range of 180°. When the secondary particles in such a limited azimuth angle range are detected, an SEM image having azimuthal property is obtained as shown in FIGS. 5A to 5D.

Figure 7D:
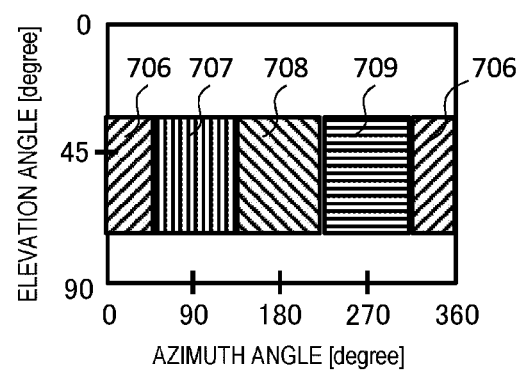
FIG. 7D shows an example of the detection acceptance of a four-direction detector in which two detectors are further provided in a paper-perpendicular direction.

FIG. 7D shows the detection acceptance of the four-direction detector in which two detectors are further provided in the paper-perpendicular direction. The azimuth angle component is symmetrically divided by four detectors. Azimuth angle components 706, 707, 708, and 709 in a range of 90° are detected by the four detectors, respectively. Since the azimuth angle component is limited as compared with a case in which two detectors are used, an SEM image in which the azimuthal property is further actualized is obtained.

Figure 8A:
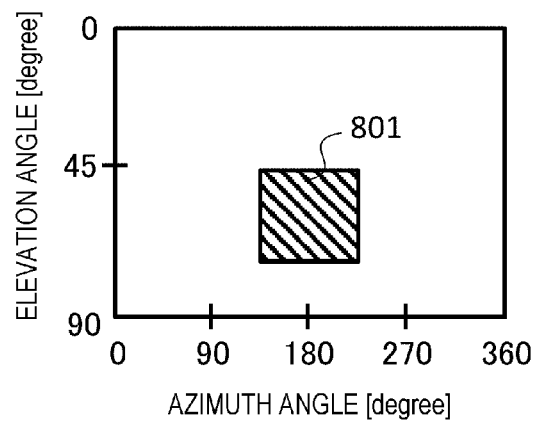
FIG. 8A shows an example of the detection acceptance in which an elevation angle range and an azimuth angle range are changed.
Figure 8B:
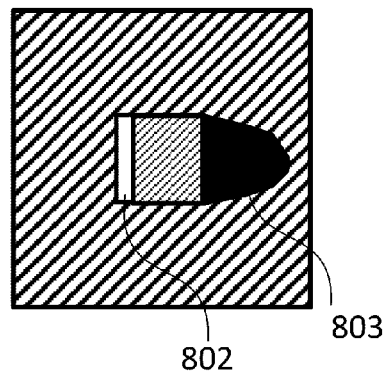
FIG. 8B shows a schematic view of an SEM image when the dot pattern in FIG. 4A is observed using a detector having the detection acceptance in FIG. 8A.
Figure 8C:
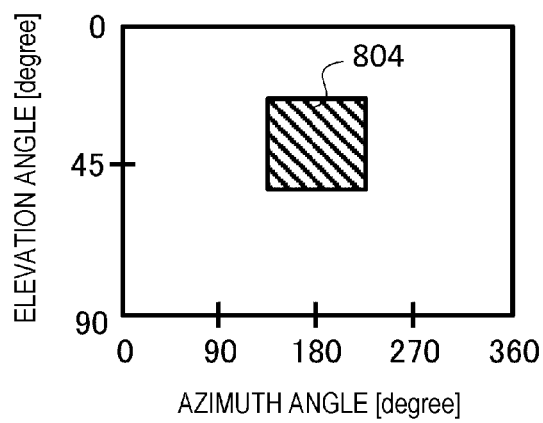
FIG. 8C shows an example of the detection acceptance in which the elevation angle range of the detection acceptance in FIG. 8A is changed.
Figure 8D:
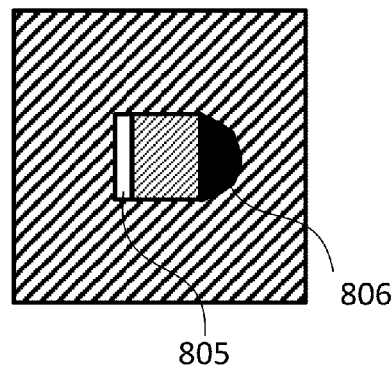
FIG. 8D shows a schematic view showing an SEM image when the dot pattern in FIG. 4A is observed using a detector having the detection acceptance in FIG. 8C.
Figure 8E:
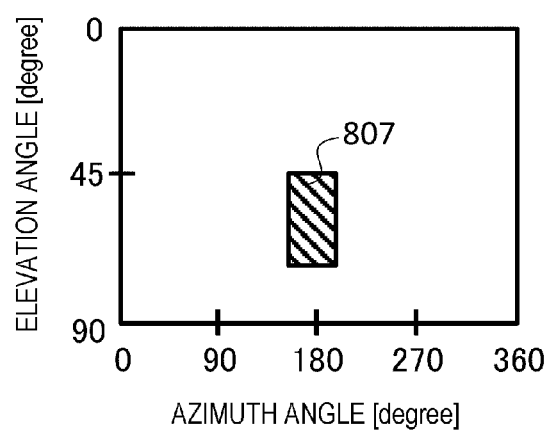
FIG. 8E shows an example of the detection acceptance in which the azimuth angle range of the detection acceptance in FIG. 8A is changed.
Figure 8F:
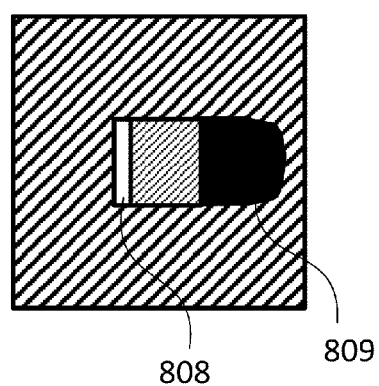
FIG. 8F is a schematic view showing an SEM image when the dot pattern in FIG. 4A is observed using a detector having the detection acceptance in FIG. 8E.

FIGS. 8A to 8F show differences in the appearance of the SEM image of the dot pattern (FIG. 4A) when the elevation angle range and the azimuth angle range of the detection acceptance are changed. In a case of the detection acceptance (range of 801 in FIG. 8A) in which the elevation angle range is 45° to 80° and the azimuth angle range is 135° to 225°, an SEM image having a white band 802 at a left edge of the dot pattern and a shadow 803 at a flat portion on a right side is observed. When the elevation angle range is changed from 30° to 50° in the same azimuth angle range (804 in FIG. 8C), a white band 805 and a shadow 806 are observed at the same position as in FIG. 8B, whereas the shadow 806 is shorter than the shadow 803 in FIG. 8B (FIG. 8D). Although the elevation angle range is the same as that in FIG. 8A, when the azimuth angle range is narrowed to a range between 160° and 200° (807 in FIG. 8E), a white band 808 and a shadow 809 are observed as in FIG. 8B. A length of the shadow is the same as that in FIG. 8B, whereas the shape is different from that in FIG. 8B. As described above, since the appearance of the SEM image is determined by the detection acceptance, the detection acceptance of the detector can be estimated by analyzing the appearance of the SEM image including the shadow in detail.

FIGS. 9A to 9D show an example of the calibration pattern for estimating the detection acceptance based on the SEM image. In the disclosure, the calibration pattern refers to a pattern whose three-dimensional shape is known by performing a measurement using an AFM, a cross-sectional SEM, a tilt SEM, or the like. The tilt SEM is a device capable of observing a pattern on a sample from an oblique direction by greatly inclining a stage. Observation from the oblique direction makes it possible to directly obtain information related to the height. Since the sample can be similarly observed from the oblique direction by inclining a column or a beam instead of or in combination with the stage, SEMs capable of these operations can be collectively referred to as the tilt SEM.

Figure 9A:
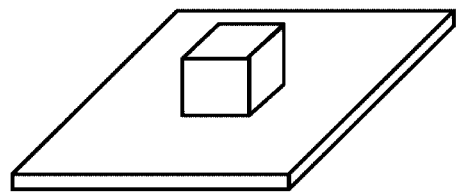
FIG. 9A shows an example of a calibration pattern for estimating the detection acceptance based on the SEM image.
Figure 9B:
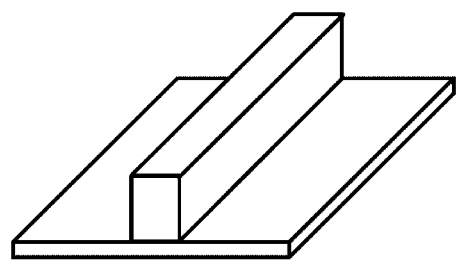
FIG. 9B shows an example of the calibration pattern for estimating the detection acceptance based on the SEM image.
Figure 9C:
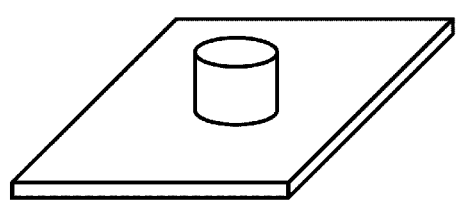
FIG. 9C shows an example of the calibration pattern for estimating the detection acceptance based on the SEM image.
Figure 9D:
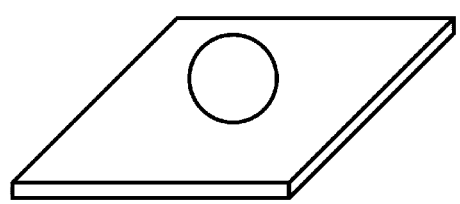
FIG. 9D shows an example of the calibration pattern for estimating the detection acceptance based on the SEM image.

It is preferable to use a simple shape as much as possible for the estimation of the detection acceptance. FIG. 9A shows an example of a dot pattern. FIG. 9B shows an example of a line pattern. FIG. 9C shows an example of a cylindrical pattern. FIG. 9D shows an example of a spherical pattern. The patterns in FIGS. 9A to 9C may be fabricated using a semiconductor lithography process. The spherical pattern in FIG. 9D may use latex particles. The samples of the calibration patterns may be prepared by a provider of the image processing system 100 and provided to the user, or may be prepared by the user himself/herself. When the provider of the image processing system 100 prepares the samples, the shape of the calibration pattern is registered in advance in the image processing system 100 at the same time. When the user himself/herself prepares the samples, it is necessary for the user to prepare the shape information of the calibration pattern. Here, if there is an error between the shape and an actual shape, it may be an error at a time of subsequent learning or shape estimation.

Figure 10:
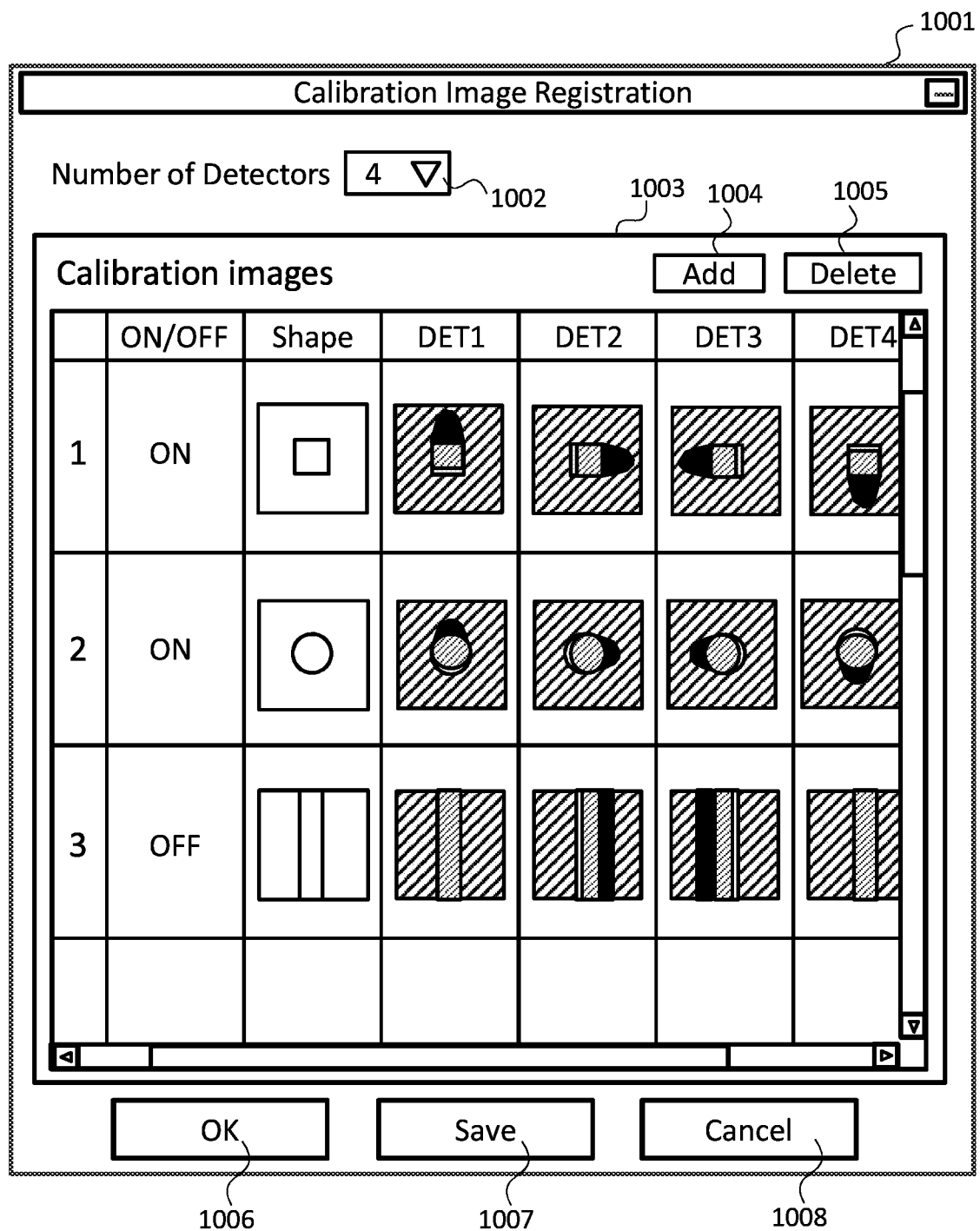
FIG. 10 is a diagram showing an example of a graphical user interface (GUI) screen for registering a shape of the calibration pattern and the SEM image.

FIG. 10 is a diagram showing an example of a graphical user interface (GUI) screen for registering the SEM image of the calibration pattern. Using a GUI screen 1001, the SEM image 105 of the calibration pattern is read from the recording device 321 of the scanning electron microscope 300 or an external storage device such as a PC, and is stored in the storage device 101. First, the user selects the number of detectors in a selection box 1002. In the drawing, since it is assumed to use a four-directional detector in which four detectors are arranged symmetrically with respect to the optical axis, "4" is selected. Thereafter, the shape of the calibration pattern and the SEM image are input. In the drawing, three calibration patterns are registered. The number of patterns to be registered can be increased or decreased by an Add button 1004 and a Delete button 1005. For example, when the Add button 1004 is pressed, one line is added. When the Delete button 1005 is pressed after a specific line (or a plurality of lines) is selected, the selected line is deleted. The SEM images may be set by double-clicking the corresponding cells one by one, or the SEM images of all the detectors simultaneously acquired for one calibration pattern may be collectively registered.

The dot pattern is registered in a first row. The cylindrical pattern is registered in a second row. The line pattern is registered in a third row. An ON/OFF column determines whether the corresponding calibration pattern is to be used in the subsequent step (S202) of creating the simulated SEM image by the calculation device 102. In the drawing, it means that results of the dot pattern and the cylindrical pattern are used in the subsequent calculation, whereas a result of the line pattern is not used. Setting of registered contents can be changed by double-clicking the corresponding cell.

In the shape data of the calibration pattern in FIG. 10, the pattern is provided at the center of the data. However, it is fairly difficult to obtain an SEM image by completely matching a position of the pattern with the shape data in units of pixels using a scanning electron microscope. When magnification is different, a display size of the pattern is also stored differently. In the present GUI screen, although it is preferable that the shape data and the SEM image completely match in the position and the magnification, such matching is not essential. At a time of image registration, a condition file (described with coordinates, magnification, and the like) at a time of image acquisition is simultaneously read. Regarding positional deviation of the image, the position is corrected by performing positional matching with the shape data using the SEM images, four composite images, and secondary electron images (for example, the SEM image acquired using the upper detector 309) acquired at the same time. Regarding the magnification, the condition file is read, and the image is enlarged or shrunk so as to match the size of the shape data. The calculation device 102 estimates the detection acceptance using the shape data and the SEM image that are registered in the present GUI. However, the calculation device 102 automatically performs the corrections in advance, thereby making it possible to estimate the detection acceptance.

When a SAVE button 1007 is pressed after all contents are registered, the registered contents are stored in a file. When an OK button 1006 is pressed, the GUI screen is closed. If the content is different from the currently stored content, a GUI screen for checking whether to store the content is displayed. When a Cancel button 1008 is pressed, the GUI screen is closed as it is.

Figure 11:
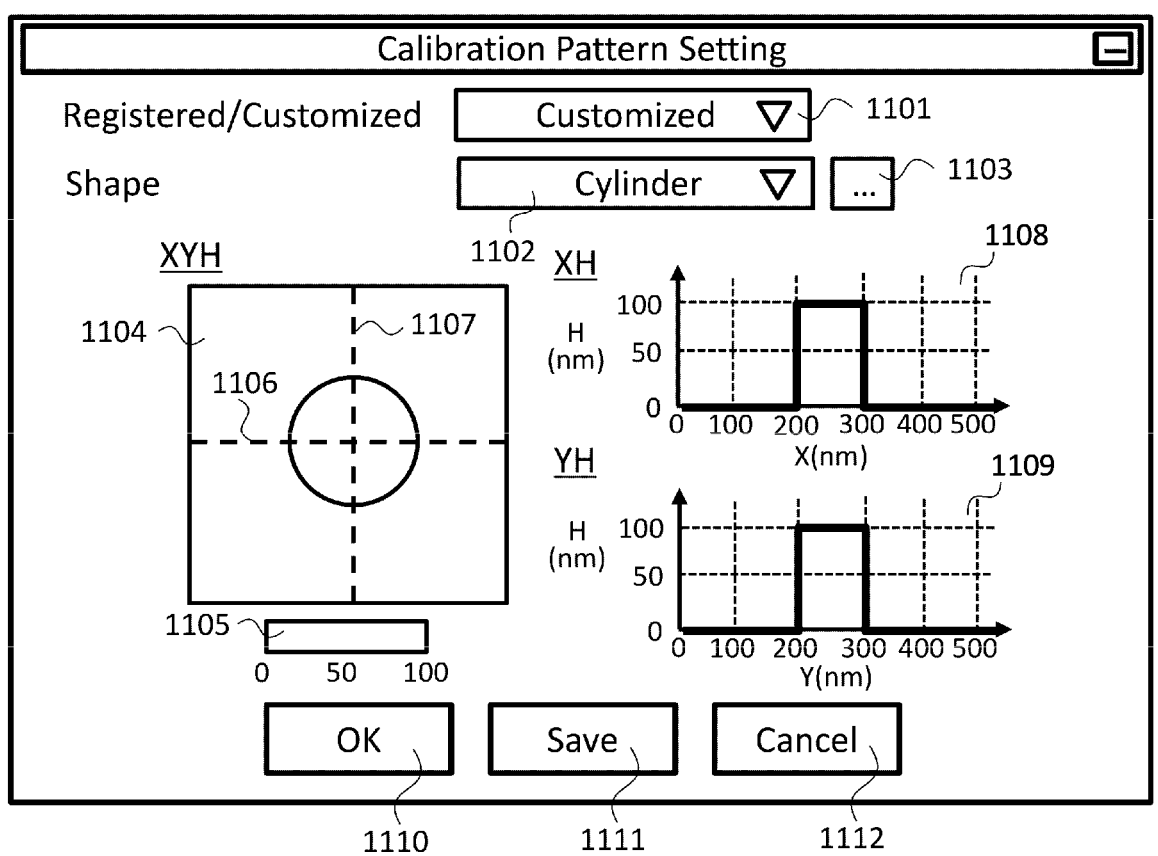
FIG. 11 shows an example of a GUI screen that is opened when a user double-clicks a cell having the shape of the calibration pattern in FIG. 10.

FIG. 11 shows an example of a GUI screen that is opened when the user double-clicks the cell of the shape data of the calibration pattern in FIG. 10. FIG. 11 shows an example of a GUI screen for specifically designating the shape of the calibration pattern. First, the user selects whether the shape of the calibration pattern is registered in advance or is to be specified from now on in a selection box 1101. Examples of the shape registered in advance include a shape prepared by the provider of the image processing system and a shape previously created and registered by the user. In the former case, for example, a name such as CalibShape1 is registered. In the latter case, as will be described later, after the shape is specified, a SAVE button 1111 on the present GUI screen is pressed to be named and stored. On the other hand, in the case in which the user specifies the shape from now on, "Customized" is selected as shown in the drawing. When "Customized" is selected, a selection box 1102 becomes active. A type of shape is selected in the selection box 1102, and details (for example, height) of the shape are set using the detail setting button 1103. For example, in the calibration pattern shown in FIG. 9, "Dot" is selected in a case of a dot, "Line" is selected in a case of a line, "Cylinder" is selected in a case of a cylinder, and "Sphere" is selected in a case of a sphere.

The currently set shape is displayed on the GUI screen. In a region 1104, a height map when the shape is viewed from above is displayed. The height can be visually understood based on a color map 1105. The color map may be color or gray level. In the region 1104, a horizontal broken line 1106 and a vertical broken line 1107 are expressed. Height maps are shown one-dimensionally on a right side of the GUI screen along the broken lines. For example, a height on the broken line 1106 is denoted by 1108, a height on the broken line 1107 is denoted by 1109, and the currently set shape can be checked in detail. The broken lines can be selected and moved with a mouse. When the SAVE button 1111 is pressed after all contents are registered, the registered contents are stored in the file. When an OK button 1110 is pressed, the present GUI screen is closed. If a result is different from the saved result, a GUI screen for checking whether to store the content is displayed. When a Cancel button 1112 is pressed, the GUI screen is closed as it is.

Figure 12:
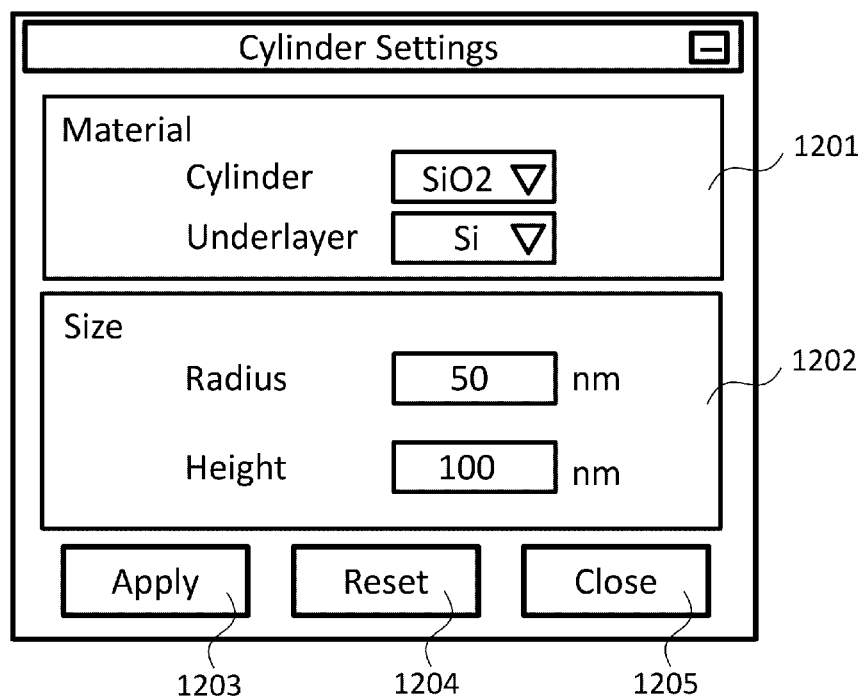
FIG. 12 shows an example of a GUI screen that is opened when a detail setting button 1103 is pressed.

FIG. 12 shows an example of a GUI screen that is opened when the detail setting button 1103 is pressed. Since "Cylinder" is selected in the selection box 1102, the GUI screen of "Cylinder Settings" is opened. In a material selection region 1201, a material of the cylinder and a material of a base can be selected in a selection box. $SiO_2$ is selected for the cylinder and Si is selected for the base. Next, a specific size of the cylinder is specified in a region 1202. Here, a radius of 50 nm and a height of 100 nm are input. If an Apply button 1203 is pressed after inputting these values, the input shape is reflected on the GUI screen in FIG. 11, and the input shape can be checked. When a Reset button 1204 is pressed, the value is returned to an initial value. When a Close button 1205 is pressed, the GUI screen for detailed setting is closed without reflecting the input numerical values.

Figure 13A:
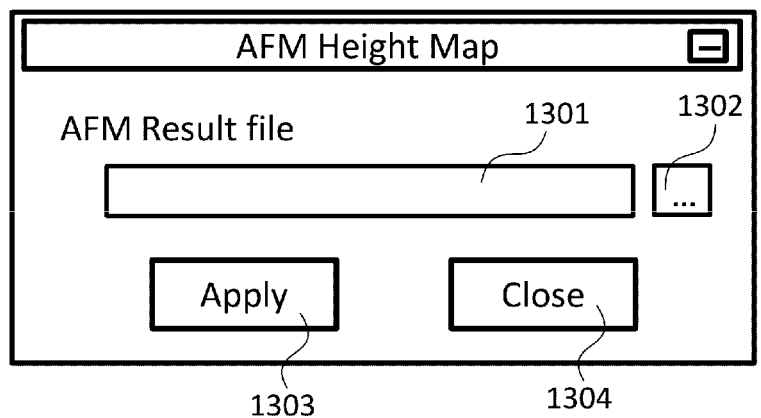
FIG. 13A shows an example of another shape input method in FIG. 11.
Figure 13B:
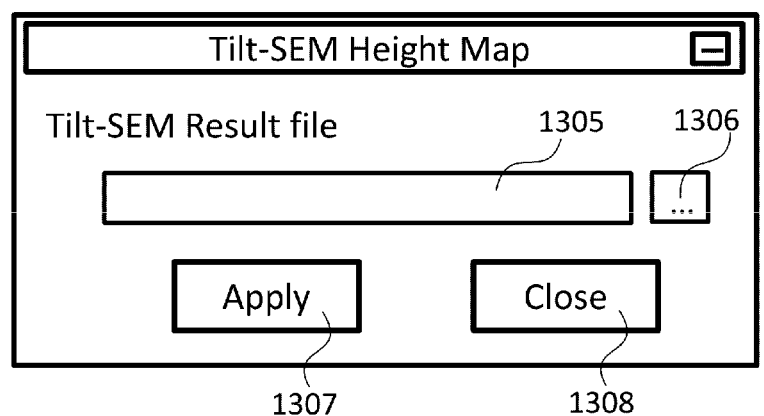
FIG. 13B shows an example of another shape input method in FIG. 11.

FIGS. 13A and 13B show an example of another shape input method in FIG. 11. In the selection box 1102 in FIG. 11, the AFM or the tilt SEM can be selected in addition to the name of the shape.

FIG. 13A shows an example of a GUI screen that is opened when the AFM is selected in the selection box 1102 and the detail setting button 1103 is pressed. When a button 1302 is pressed, a file dialog is opened. When a result file in which a height map obtained by measurement using the AFM is described is selected, an address thereof is displayed in 1301. When an Apply button 1303 is pressed, an AFM result file is read and reflected on the GUI screen in FIG. 11. On the other hand, when a Close button 1304 is pressed, the GUI screen for detailed setting is closed without reading the AFM result file.

FIG. 13B shows an example of a GUI screen that is opened when the tilt SEM is selected in the selection box 1102 and the detail setting button 1103 is pressed. When the button 1306 is pressed, the file dialog is opened. When a result file in which a height map obtained using an image acquired using the tilt SEM is described is selected, an address thereof is displayed in 1305. A stereo method can be employed as a general method for calculating the height map based on the inclined SEM image, whereas another method may be used. When an Apply button 1307 is pressed, the result file of the tilt SEM is read and reflected on the GUI screen in FIG. 11. On the other hand, when the Close button 1308 is pressed, the GUI screen for detailed setting is closed without reading the result file of the tilt SEM.

Figure 14:
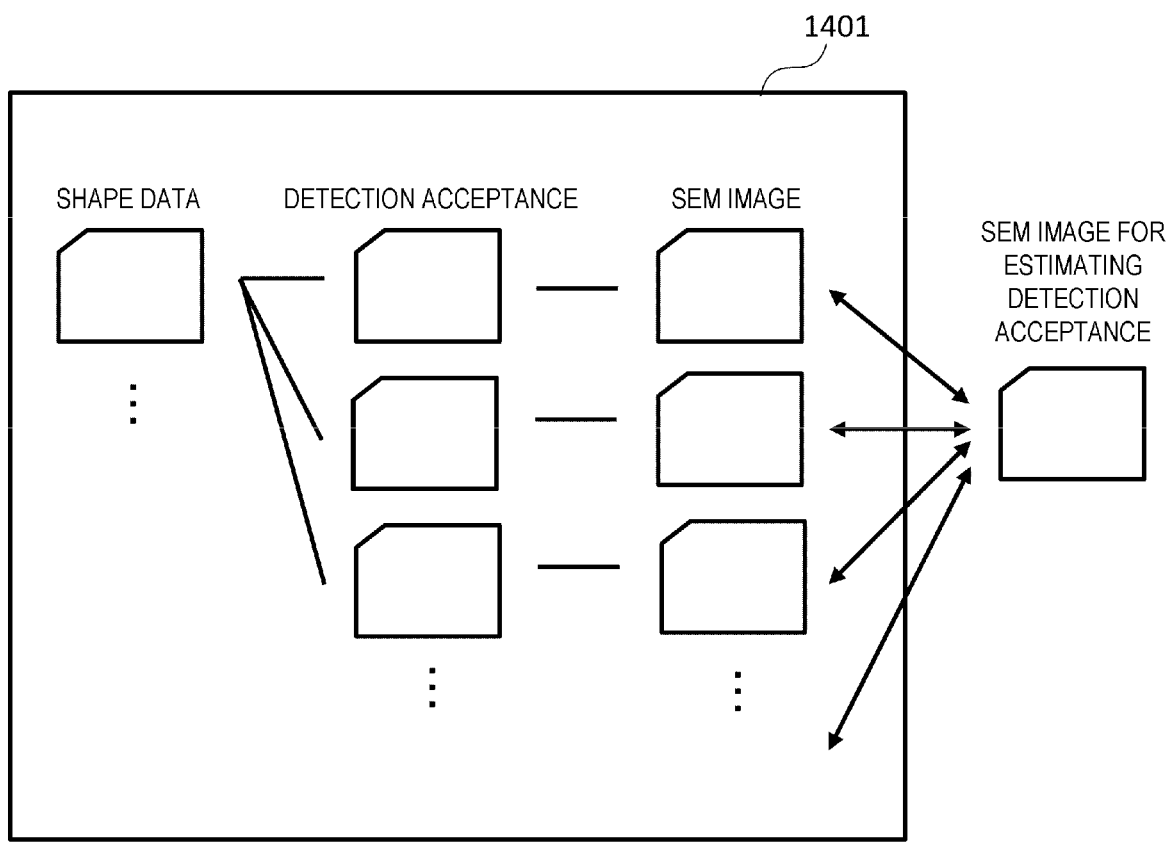
FIG. 14 is a schematic view showing a method of estimating the detection acceptance.

FIG. 14 is a schematic view showing a method of estimating the detection acceptance. The calculation device 102 first estimates, based on the SEM image of the calibration pattern, the detection acceptance of the detector that has acquired the SEM image. SEM images that are obtained by variously changing the detection acceptance or are created by simulation are prepared for each piece of shape data. A plurality of pieces of detection acceptance and SEM images corresponding thereto are prepared for one piece of shape data. Although the detection acceptance and the SEM images that correspond to one shape are shown in the drawing, results of a plurality of pieces of shape data are actually included. These are prepared in advance as a library 1401. The calculation device 102 reads the SEM image 105 (described as the SEM image for estimating the detection acceptance in FIG. 14) of the calibration pattern stored in the storage device 101 by the user, and selects the SEM image having the highest degree of coincidence from the SEM images of various detection acceptances having the corresponding shapes. The calculation device 102 estimates the detection acceptance of the image as the detection acceptance of the detector. When the SEM images of the plurality of calibration patterns are used, the detection acceptance corresponding to the SEM image having the highest average degree of coincidence is estimated as the detection acceptance of the detector. It is also possible to select the SEM image based on a selection criterion other than the selection of the SEM image having the highest average degree of coincidence. In this manner, the detection acceptance can be estimated based on the SEM image of the calibration pattern. Here, as a method of estimating the detection acceptance, a method of using a library in which the SEM images of various detection acceptances are registered for each shape is described, whereas machine learning or another method may be used as long as the detection acceptance can be estimated based on the SEM image.

The calculation device 102 stores the estimated detection acceptance in the storage device 101 (or another appropriate storage device, for example, a memory device). The calculation device 102 generates a simulated SEM image using the stored detection acceptance. Also in a case in which the detection acceptance is acquired based on another method (for example, sixth to seventh embodiments to be described later), it is common to use the detection acceptance stored in the storage device.

After estimating the detection acceptance, the calculation device 102 creates simulated SEM images for various shapes. Here, the various shapes do not mean the shapes of the calibration patterns, but mean shapes acquired by changing a part of the shapes of structures to be estimated or a part of shapes similar to the structures to be estimated.

Figure 15:
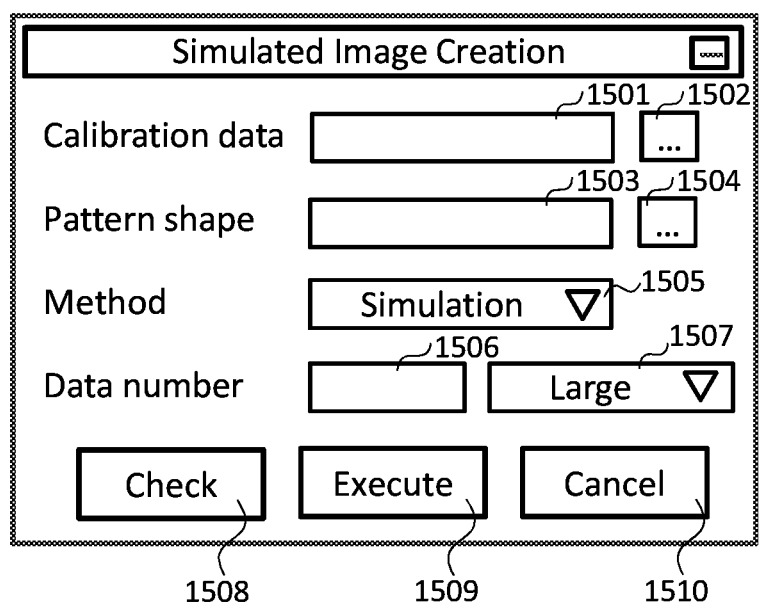
FIG. 15 shows an example of the GUI screen for creating a simulated SEM image.

FIG. 15 shows an example of a GUI screen for creating the simulated SEM image. When a selection button 1502 is pressed, a file dialog is opened. When a result of estimating the detection acceptance is selected, a file name is displayed on a display 1501. Next, a shape for creating the simulated SEM image is selected by a selection button 1504, and a file name is displayed on a display 1503. A method of creating the simulated SEM image can be selected in a selection box 1505. Examples of a representative method include a Monte Carlo simulation, an analytical method, and a numerical analysis method, and these methods can be selected.

The Monte Carlo simulation is a method of calculating, using a Monte Carlo method (simulation using random numbers), a scattering process in a sample when the sample is irradiated with an electron beam, and calculating a distribution and a total number of secondary particles emitted from the sample. An energy and angular distribution of the emitted secondary particles are multiplied by the detection acceptance, thereby creating the simulated SEM image. The Monte Carlo simulation has high accuracy and can reproduce an actual SEM image very well, but has a problem that a calculation time is long. However, in recent years, the Monte Carlo simulation is developed in which a speed is increased using graphics processing units (GPU). By utilizing GPU, it is possible to shorten the problematic calculation time, while maintaining the high accuracy. The analytical method is a method of creating the simulated SEM image by expressing an appearance of a white band or a shadow for a shape using a mathematical expression without considering scattering in the sample. How much the actual SEM images can be reproduced depends on accuracy of the mathematical expression. On the other hand, since the scattering process in the sample is not calculated in the analytical method, it is possible to significantly shorten the calculation time. In the numerical analysis method, a distribution of the secondary particles emitted from a sample surface is assumed and is made in a form of a matrix, and then the simulated SEM image is created by multiplying the matrix, a matrix of the shape data, and a matrix representing the detection acceptance. Although the numerical analysis method can significantly shorten the calculation time as compared with the Monte Carlo simulation, the calculation time is longer than that in the analytical method. Here, each method is described. However, it is also possible to combine both methods, for example, using the Monte Carlo simulation for a part having a significant shape change and using the analytical method for the other part having a small shape change. As described above, there are various methods of creating the simulated SEM image, and any method may be used as long as the simulated SEM image can be created. That is, any method may be used as long as it is possible to simulate the number of secondary particles that are emitted from the sample and reach the detector at each position on the sample and to create the simulated SEM image. A data number is the number of the simulated SEM images to be created. The data number may be directly written in an input box 1506, or the number of pieces of data recommended by the image processing system 100 may be automatically set in a selection box 1507.

When a Check button 1508 is pressed after all contents are set, the simulated image is picked up and created according to the contents set so far, and sensitivity which is a relationship between the shape change at the location to be measured and a gradation value change of the SEM image is evaluated. Thereafter, when an Execute button 1509 is pressed, creation of the simulated SEM image is started under the set conditions. When the Cancel button is pressed, the present GUI screen is closed without creating the simulated SEM image.

Figure 16:
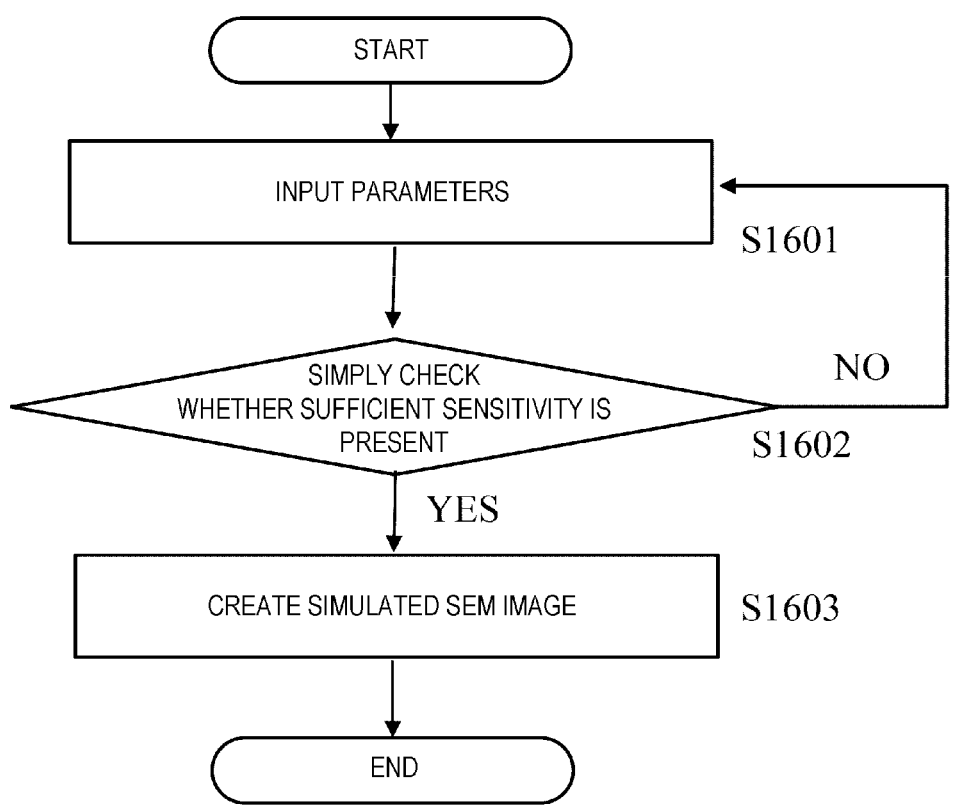
FIG. 16 is an example of a flowchart for creating the simulated SEM image using the GUI screen in FIG. 15.

FIG. 16 shows an example of a flowchart for creating the simulated SEM image using the GUI screen in FIG. 15. First, calibration data 1501, a shape 1503 for creating the simulated SEM image, a method 1505 for creating a simulated SEM image, and the data numbers 1506 and 1507 are input (S1601). When the Check button 1508 is pressed after the calibration data 1501, the shape 1503, the method 1505, and the data numbers 1506 and 1507 are input, a simulated SEM image of a part of the shape is picked up and created based on the set contents. As a pickup condition, a point at which a change in shape to be evaluated in particular is large is automatically selected. The data number to be picked up is preferably approximately 1/10 of the data number set in FIG. 15, but may be larger or smaller than 1/10 of the data number. Then, the sensitivity of the simulated SEM image for the change in the shape is checked in the picked up simulated SEM image (S1602). Specifically, a change amount (for example, a change amount of a gradation value) of an image around the shape when the shape is changed is evaluated. For example, when the change in the gradation value is small with respect to the change in the shape, the sensitivity is small, and it is difficult to read the shape change from the change in the gradation value. On the other hand, when the change in the gradation value is large with respect to the change in the shape, the sensitivity is high, and it is easy to read the shape change from the change in the gradation value. However, if the sensitivity is too high, since the shape changes greatly due to a slight gradation value change, there is also a problem that the sensitivity is too high. A picked up simulated SEM image may be displayed so that the user can directly check a result of the sensitivity evaluation, or a relationship between the change in shape and the change in gradation value may be displayed using a graph. If necessary and sufficient sensitivity is observed, the Execute button 1509 is pressed to create the simulated SEM image under the set conditions (S1603). When there is no sensitivity or when the sensitivity cannot be attained as expected, the processing returns to the parameter input, the input parameter is corrected, and the sensitivity checking is performed again. Whether the sensitivity is sufficient may be visually checked by the user, or may be automatically determined by the calculation device 102 comparing the change amount in the image with a determination threshold value.

Figure 17:
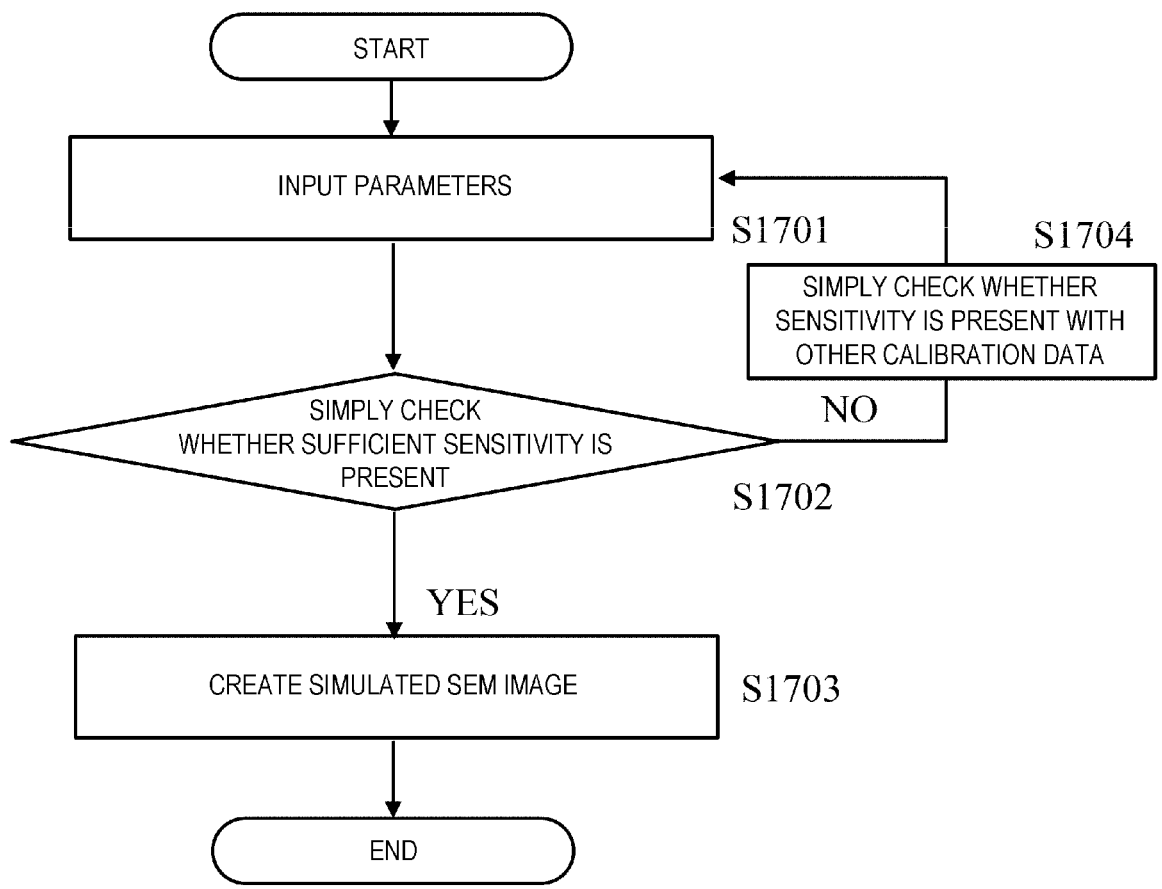
FIG. 17 is another example of the flowchart for creating the simulated SEM image using the GUI screen in FIG. 15.

FIG. 17 shows another example of a flowchart for creating the simulated SEM image using the GUI screen in FIG. 15. The input of the parameters (S1701), the checking of the sensitivity (S1702), and the creation of the simulated SEM image (S1703) are the same as the corresponding steps in FIG. 16. When it is determined in S1702 that there is no sufficient sensitivity, if a plurality of pieces of calibration data are stored in advance, it is evaluated whether there is sufficient sensitivity in all or a part of the pieces of calibration data, or the calibration data specified by the user (S1704). Here, other calibration data means an SEM image acquired in a calibration pattern by using a same detector under different optical conditions such as irradiation energy or an acceleration voltage or by using different detectors. The user is notified of whether there is calibration data having sensitivity higher than that of the firstly configured calibration data. Based on a result, the user determines whether to change the calibration data.

Figure 18A:
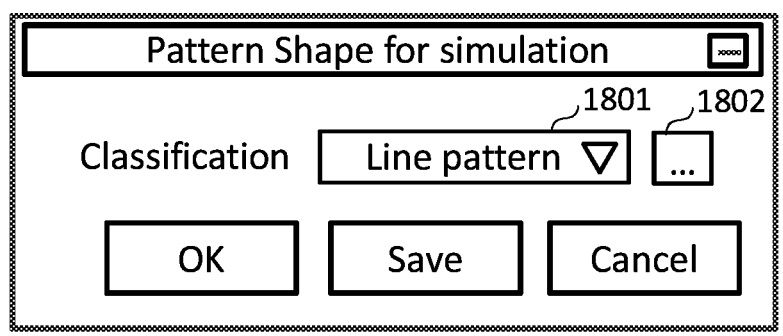
FIG. 18A shows an example of a GUI screen for setting a shape for creating the simulated SEM image.
Figure 18B:
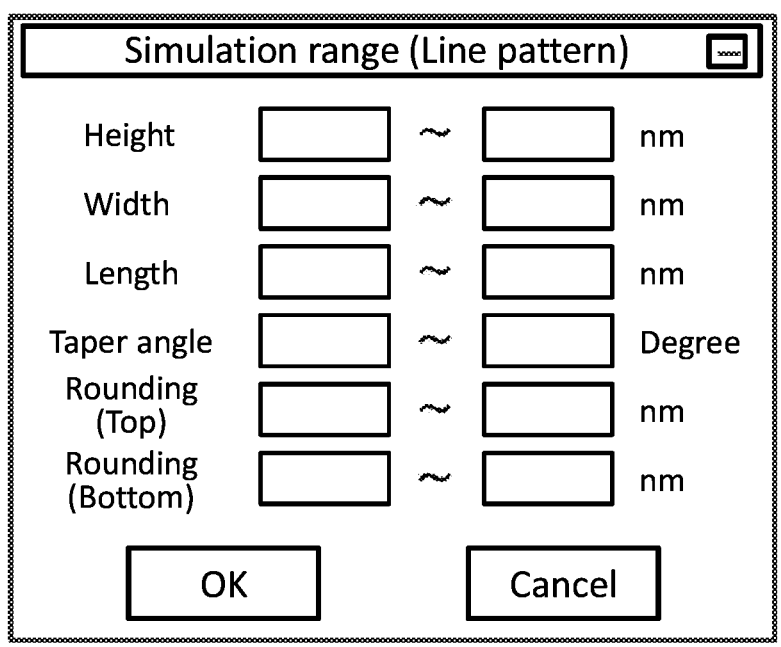
FIG. 18B shows an example of a GUI screen that is opened when a detail setting button 1802 is pressed.

FIGS. 18A and 18B show an example of a GUI screen for setting the shape for creating the simulated SEM image. A representative example in which the three-dimensional shape is required to be estimated using a length measurement SEM or a defect review SEM is a resist pattern or a particle after development. Since the resist pattern after the development is processed by etching a lower layer using the resist pattern as a hard mask, quality of the resist pattern greatly affects processing accuracy of the etching. One example of the resist pattern to be evaluated is a line-shaped pattern.

FIG. 18A is an example of a GUI screen for setting a shape of a line pattern for creating the simulated SEM image. When the line pattern is selected in a selection box 1801 and the detail setting button 1802 is pressed, the GUI screen in FIG. 18B is opened. In a case of the line pattern, a height, a width, a length, a taper angle, and roundings of a top portion and a bottom portion are shape parameters. In the drawing, an upper limit and a lower limit are set for each of the shape parameters. Instead of the upper limit and the lower limit, a reference value and a change amount or a change rate from the reference value may be input. Here, in a case in which a measurement target is a semiconductor pattern, it is preferable to set the shape parameter in a manner of covering as widely as possible a change in shape that may occur due to a process variation. Although not shown in the GUI screen in FIG. 18B, the line pattern and a material of the lower layer may also be input. Furthermore, the simulated SEM image may be created using a two-dimensional pattern that is bent or branched in the middle, in addition to a one-dimensional line pattern. The shape parameters depend on the shape selected in the selection box 1801. For example, when a particle is selected, the shape parameters include a height, a width, and a taper angle.

As described above, in a case of a standard shape such as the line pattern or the particle, shape parameters to be set are known, and thus are registered in advance in the image processing system 100. However, the patterns to be measured by the user include not only the above patterns but also patterns having complicated shapes. Therefore, when the height map is calculated for a complicated and new shape different from the registered shapes, the user needs to create and specify the shape.

Figure 19A:
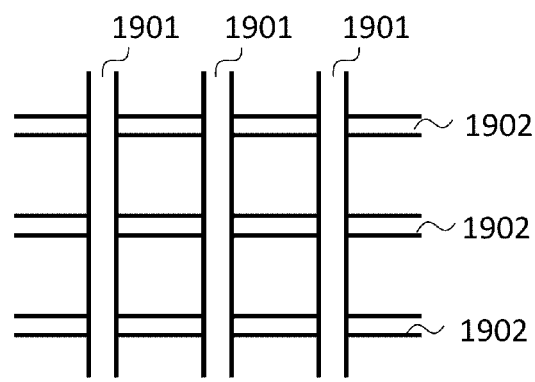
FIG. 19A shows a fin field-effect transistor (FinFET) serving as an example of a pattern to be measured that requires a three-dimensional measurement.
Figure 19B:
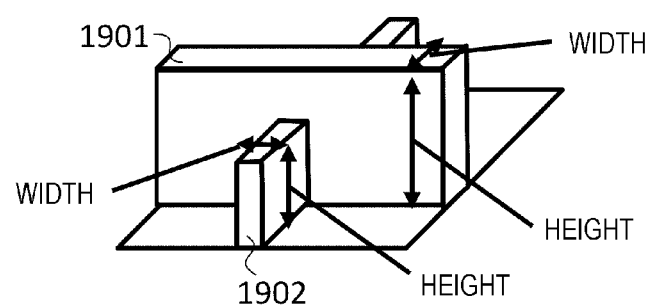
FIG. 19B is a diagram showing the FinFET as viewed obliquely from above.
Figure 19C:
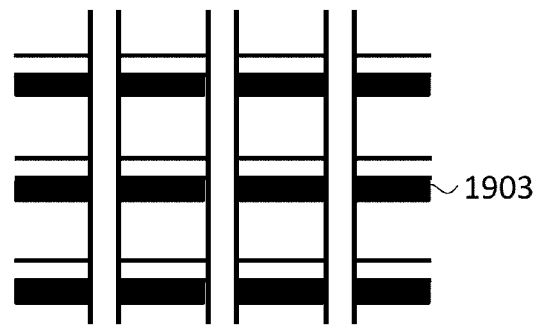
FIG. 19C is a schematic view showing an SEM image when the FinFET in FIG. 19A is acquired using a detector provided on an upper side of the SEM image.
Figure 19D:
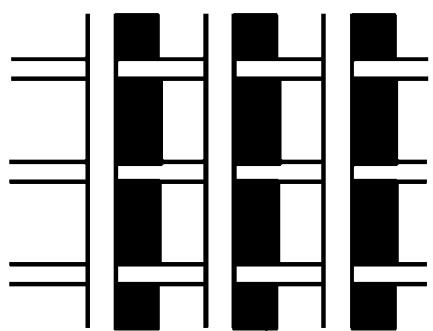
FIG. 19D is a schematic view showing an SEM image when the FinFET in FIG. 19A is acquired using a detector provided on a left side of the SEM image.

FIGS. 19A to 19D show a fin field-effect transistor (FinFET) as an example of a pattern to be measured that requires the three-dimensional measurement. The FinFET is a kind of field effect transistor, has a structure in which a gate is positioned in a manner of surrounding a channel, and has a fast switching time and a high current density. FIG. 19A shows a shape of the FinFET as viewed from above. There are three channels 1902 in the horizontal direction and three gates 1901 in the vertical direction. FIG. 19B is a view showing these intersection portions as viewed obliquely from above. The gate 1901 is formed in a manner of covering the channel 1902. A measurement target is represented by a width and a height of the channel and the gate. However, particularly for the channel, the taper angle and the rounding of the top portion are also included as measurement targets since the device characteristics are greatly affected. Further, depending on the user, there is a need to know not only the numerical values but also the three-dimensional shape itself. By specifying variation ranges, creating a plurality of shapes in various combinations, creating corresponding simulated SEM images, and learning a combination of the simulated SEM images and the corresponding shapes, it is possible to estimate a height map based on the acquired SEM image even for such a shape. FIG. 19C shows an example of the SEM image when the detector is provided on an upper side of the image. FIG. 19D shows an example of the SEM image when the detector is provided on a left side of the image. Shadows 1903 and 1904 are observed on an opposite side of the detector. Although not shown in the drawing, a white band is observed on the detector side on the pattern.

Figure 20A:
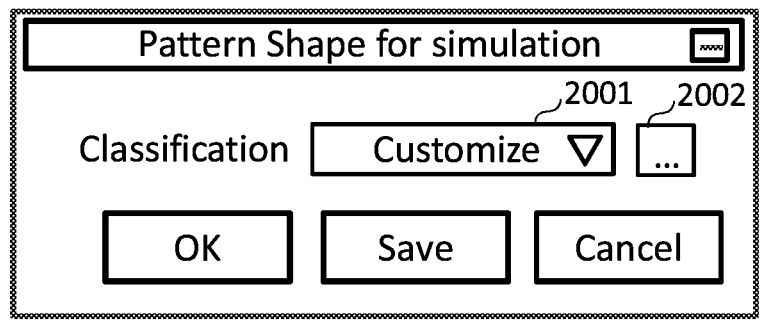
FIG. 20A shows an example of a GUI screen for specifying a new shape that is not registered.
Figure 20B:
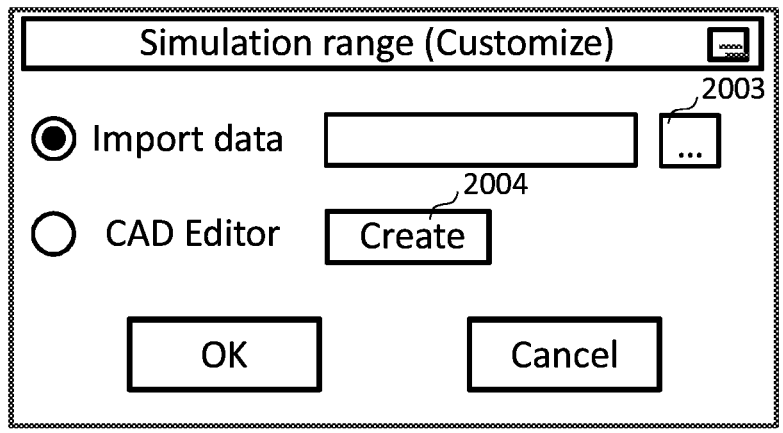
FIG. 20B shows an example of a GUI screen that is opened when a detail setting button 2002 is pressed.

FIGS. 20A and 20B show an example of a GUI screen for specifying a new shape that is not registered. FIGS. 19A to 19D show an example of such a new shape. When Customize is selected in a selection box 2001 in FIG. 20A and the detail setting button 2002 is pressed, the GUI screen in FIG. 20B is opened. On the GUI screen in FIG. 20B, data can be imported or a CAD Editor can be selected. When the data is imported, previously created CAD data can be read. The CAD data to be imported is selected by pressing a button 2003. When the CAD Editor is selected and a Create button 2004 is pressed, the CAD Editor opens. The CAD Editor has the same structure as general CAD. A sample structure can be drawn on the CAD, and materials can be specified for each part. Further, by specifying the size to be changed as shown in FIG. 18B, for example, it is possible to set the shape in which a change width is specified as in FIG. 18B.

Figure 21:
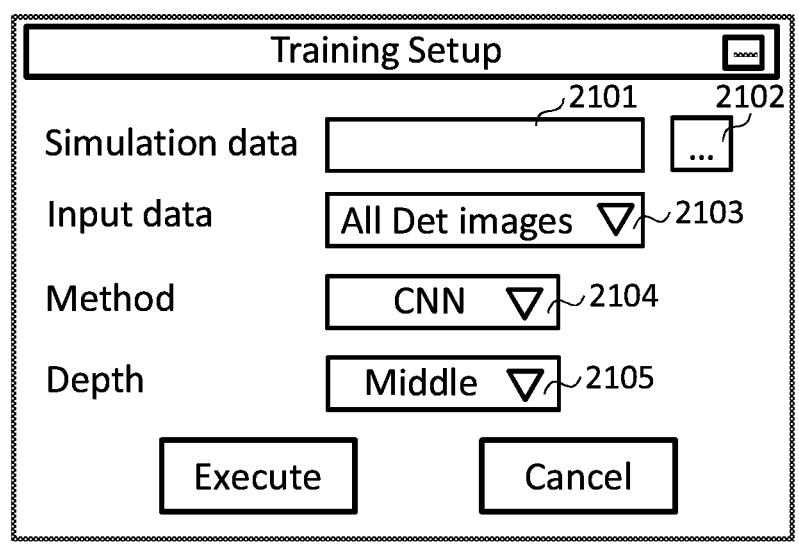
FIG. 21 shows an example of a GUI screen for instructing a content to be learned by a learner 103.

FIG. 21 shows an example of a GUI screen for instructing the content to be learned by the learner 103. When the simulated SEM image is created, the calculation device 102 learns the relationship between the simulated SEM image and the shape data corresponding thereto. When a button 2102 is pressed, a file dialog is opened, and a set of shape data corresponding to the simulated images created using FIGS. 15 to 20 is read and displayed on a display 2101. Input data can be selected in a selection box 2103. For example, at a time of learning, the input data is the simulated SEM image, and the output data is the height map. The simulated SEM image of the input data can be selected. Normally, the simulated SEM images of all the detectors (the lower detectors 312 and 313 in a case of the scanning electron microscope 300) that acquire the SEM images used for the height map estimation are used as the input data. For example, in a case of a one-dimensional line pattern, shadow is not observed in a detector provided in the longitudinal direction of the line direction, which may cause a decrease in accuracy at a time of calculating the height map. In this case, only the simulated SEM image of the detector provided perpendicular to the line is used for learning. Not only the simulated SEM images of the plurality of detectors but also a simulated SEM image obtained by synthesizing the SEM images, a simulated SEM image in which a contour is emphasized, a height map obtained using shape from shading, and the like can be added to the input data, and the user can optionally set the input data. A learning algorithm can also be selected in a selection box 2104. Here, a general convolutional neural network (CNN) is specified. However, other methods (for example, SegNet and U-Net) can also be specified. The learning algorithm can be added by a manufacturer of the image processing system 100. Finally, the user can specify a depth of learning in a selection box 2105. If the depth is small, a learning time is short, but learning accuracy is low. However, if the depth is large, the learning accuracy is high, but the learning time is increased.

Figure 22:
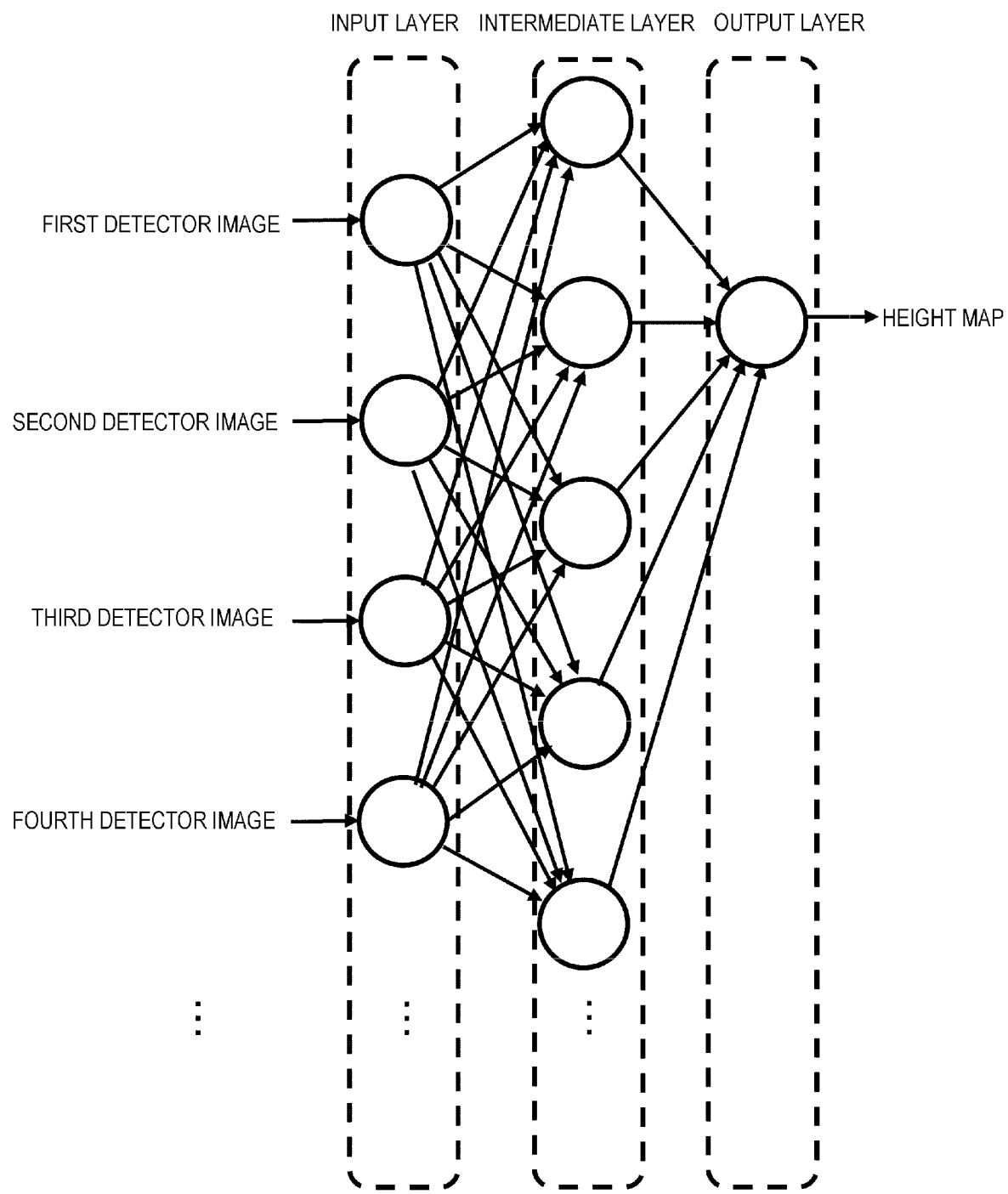
FIG. 22 is a diagram showing a configuration example of the learner 103.

FIG. 22 is a diagram showing a configuration example of the learner 103. Here, an example in which the learner 103 is formed using a neural network will be described. The learner 103 includes, as an input layer, an input unit that inputs the SEM image acquired by each detector. The neural network outputs the height map from an output layer by sequentially propagating information inputted to the input layer to an intermediate layer and then to the output layer. The intermediate layer includes a plurality of intermediate units. The information inputted to the input layer is weighted by a coupling coefficient between the input unit and the intermediate unit, and is inputted to the intermediate unit. By adding the inputs to the intermediate units, values of the intermediate units are obtained. The values of the intermediate units are nonlinearly converted by an input and output function. The output of the intermediate unit is weighted by the coupling coefficient between the intermediate unit and the output unit, and is inputted to the output unit. By adding the inputs to the output units, an output value of the output layer is obtained. By advancing the learning, parameters (constants, coefficients, and the like) such as a coupling coefficient between units and a coefficient describing the input and output functions of each unit are gradually optimized. The storage device 101 can store optimized values as a learning result of the neural network.

Figure 23:
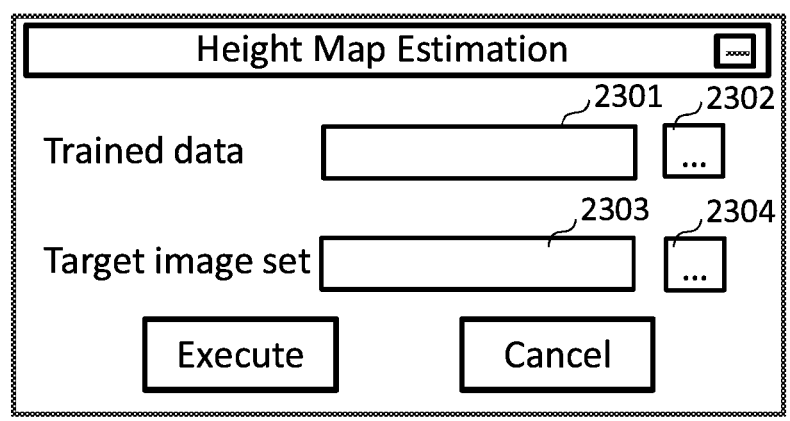
FIG. 23 shows an example of a GUI screen for instructing the learner 103 to output a height map from an actual SEM image using results learned in FIGS. 21 and 22.

FIG. 23 shows an example of a GUI screen that instructs the learner 103 to output the height map from the actual SEM image using the results learned in FIGS. 21 and 22. When a button 2302 is pressed to open a file dialog and the learning result is selected, a name of the learning result is displayed on a display 2301. An actual SEM image whose height map is to be estimated is selected from the file dialog or a folder dialog opened by a button 2304. An image name and a folder name of the selected file are displayed on a display 2303. When an Execute button is pressed, an actual SEM image is input to the learner 103 as the input data of the learning result. The output device 104 outputs the height map estimated by the learner 103.

Figure 24:
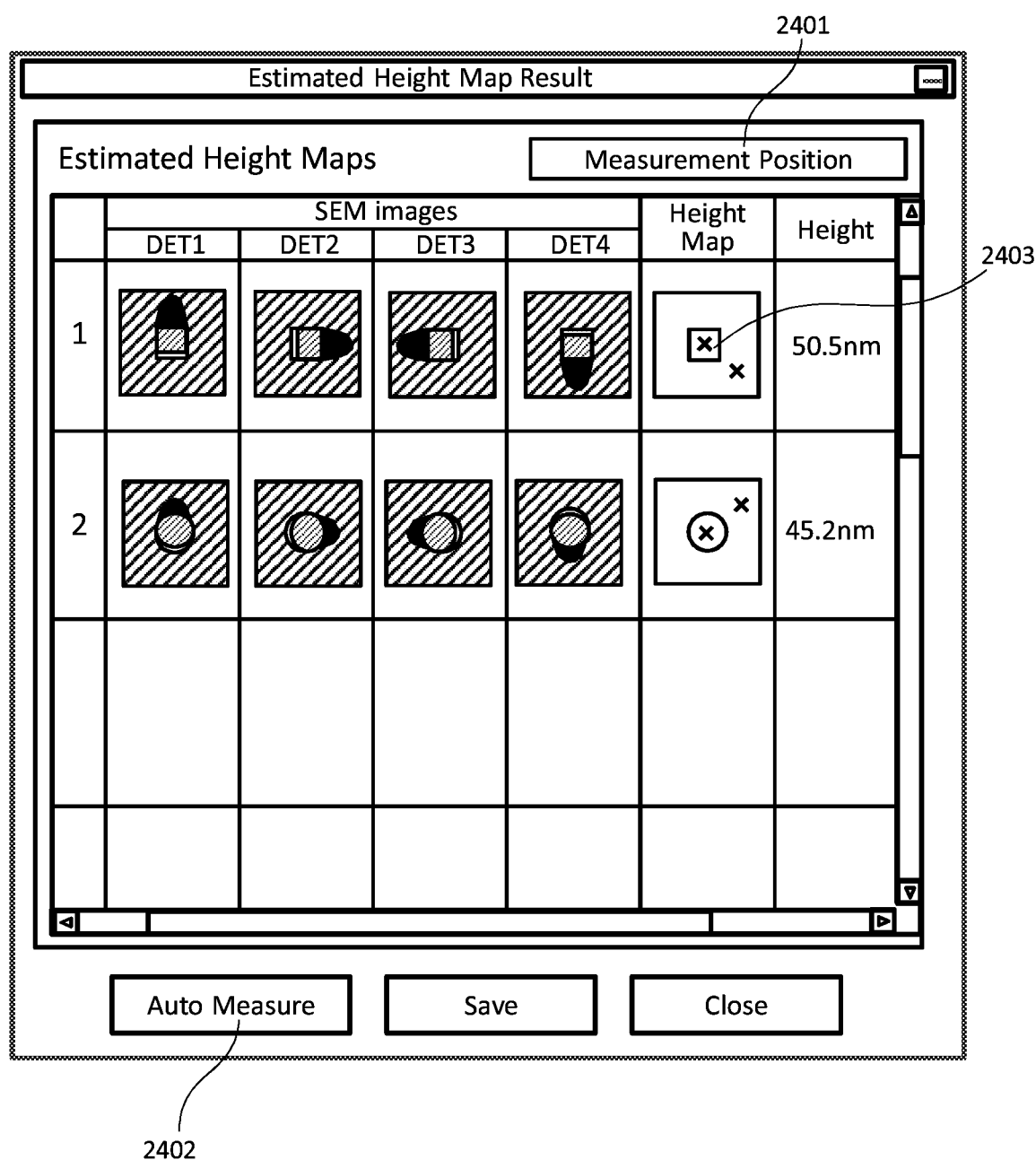
FIG. 24 shows an example of a GUI screen that displays the estimated height map.

FIG. 24 shows an example of a GUI screen that displays the estimated height map. The input actual SEM image, the estimated height map, and the measurement result (height in the drawing) based on the height map are displayed. A mark indicating a position at which a measurement value is calculated based on the height map may be displayed on the height map. For example, in the drawing, the height is measured, a cross mark 2403 is displayed on the pattern portion and the flat portion, and a result is displayed using a height difference between the pattern portion and the flat portion as the height. For example, in a case of height calculation, it is possible to calculate an average value by specifying a measurement range in regions corresponding to a high portion and a low portion, and to calculate a difference between the average values obtained in the regions as the height. In this case, the region used for the height calculation may be colored and displayed. Of course, the pattern portion may be specified using a point, and the flat portion may be specified using a region. When the taper angle of the pattern is measured, an edge portion of the corresponding pattern may be displayed in color or thickened, and a measurement location is displayed on the height map in accordance with each measurement target. The shape value to be read from the height map is specified by pressing the button 2401, and a column of a measurement result is added or deleted on the right side of the table based on the specified content. When an Auto Measure button 2402 is pressed, the shape value specified by the button 2401 is automatically measured based on each height map. Alternatively, after the cell of the measurement value to be measured is selected, the Auto Measure button 2402 may be pressed to re-measure the cell only. When a Save button is pressed, the content of the present GUI screen is stored, whereas a height measurement result or the like may be separately stored as text data.

Figure 25:
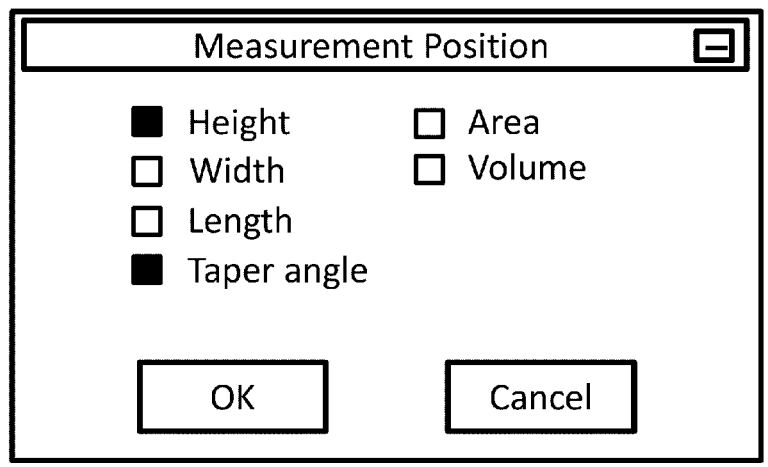
FIG. 25 shows an example of a GUI screen that is opened when a button 2401 in FIG. 24 is pressed.

FIG. 25 shows an example of a GUI screen that is opened when the button 2401 shown in FIG. 24 is pressed. Here, a height, a width, a length, a taper angle, an area, and a volume can be specified as the measurement position. By checking a check box, it is possible to specify what is to be measured based on the height map.

Figure 26:
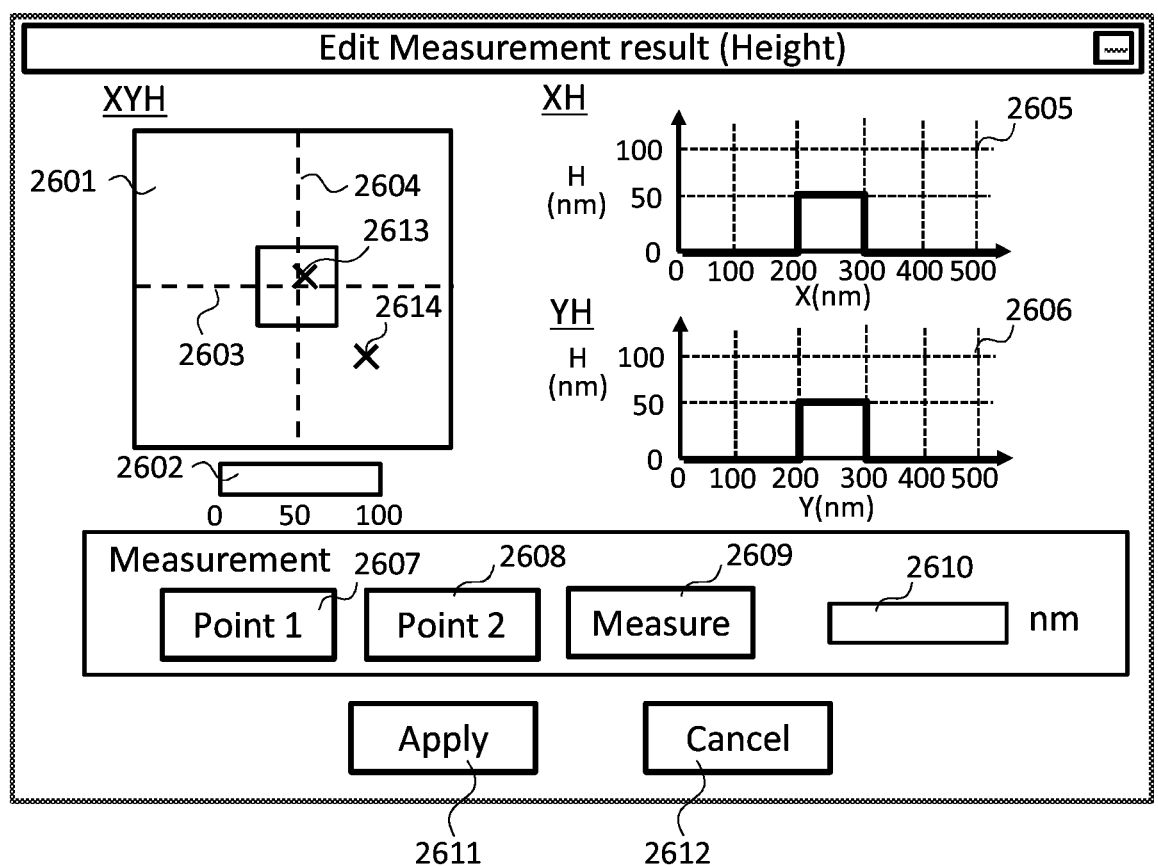
FIG. 26 shows an example of a GUI screen that is opened when a Height cell (50.5 nm) of a shape number "1" in FIG. 24 is clicked.

FIG. 26 shows an example of a GUI screen that is opened when a Height cell (50.5 nm) of the shape number "1" in FIG. 24 is clicked. In the present GUI screen, it is possible to correct the measurement result along with viewing the actual height map. In a region 2601, a height map when viewed from above is displayed. The height can be visually understood by a color map 2602. The color map may be color or gray level. In the region 2601, a horizontal broken line 2603 and a vertical broken line 2604 are shown. The height maps along the broken lines are expressed one-dimensionally on the right side of the GUI screen. For example, a height on the broken line 2603 is denoted by 2605, a height on the broken line 2604 is denoted by 2606, and the estimated height map can be reviewed in detail. The broken lines can be selected and moved using a mouse. A Point1 button 2607 in a Measurement region is pressed and then a certain position in the region 2601 or a point on the profiles 2605 or 2606 is pressed. Next, a Point2 button 2608 is pressed and then a certain position in the region 2601 or a point on the profiles 2605 or 2606 is pressed. Then a difference in height between the Point1 and the Point2 is calculated and displayed on a display 2610. A position selected in the region 2601 after the Point1 button 2607 is pressed may be displayed as a cross mark 2613, and a position selected in the region 2601 after the Point2 button 2608 is pressed may be displayed as another cross mark 2614, so that the user can visually check which position is selected as the Point1 or the Point2. Here, since the cross mark is selected in the region 2601, the cross mark is displayed only in the region 2601. However, in order to distinguish between the two cross marks, the color or the thickness may be changed. Similarly to FIG. 24, a region to be measured may be displayed so as to be visible by coloring, oblique lines, or the like. Here, if an Apply button 2611 is pressed, it is reflected in the corresponding cell in FIG. 24. When a Cancel button 2612 is pressed, the GUI screen is closed without doing anything.

When the height map is calculated, the entire height map may have an inclination. In this case, although not shown in the GUI in FIG. 26, a baseline correction function may be provided similarly to the AFM to correct the inclination of the entire height map before the height measurement.

<Summary of First Embodiment>

The image processing system 100 according to the first embodiment can estimate the height map of the SEM image by storing the SEM image of the calibration pattern in the storage device, calculating the detection acceptance by the calculation device to create the simulated SEM image with a plurality of shapes, learning the shape data corresponding to the simulated SEM image by the learner, and inputting the actual SEM image of the pattern for which the height map is to be estimated into the learning result.

Second Embodiment

In a second embodiment of the disclosure, another configuration example of the scanning electron microscope 300 will be described. The configuration of the image processing system 100 is the same as that according to the first embodiment. Matters described in the first embodiment and not described in the second embodiment can also be applied to the second embodiment unless there are special circumstances.

Figure 27:
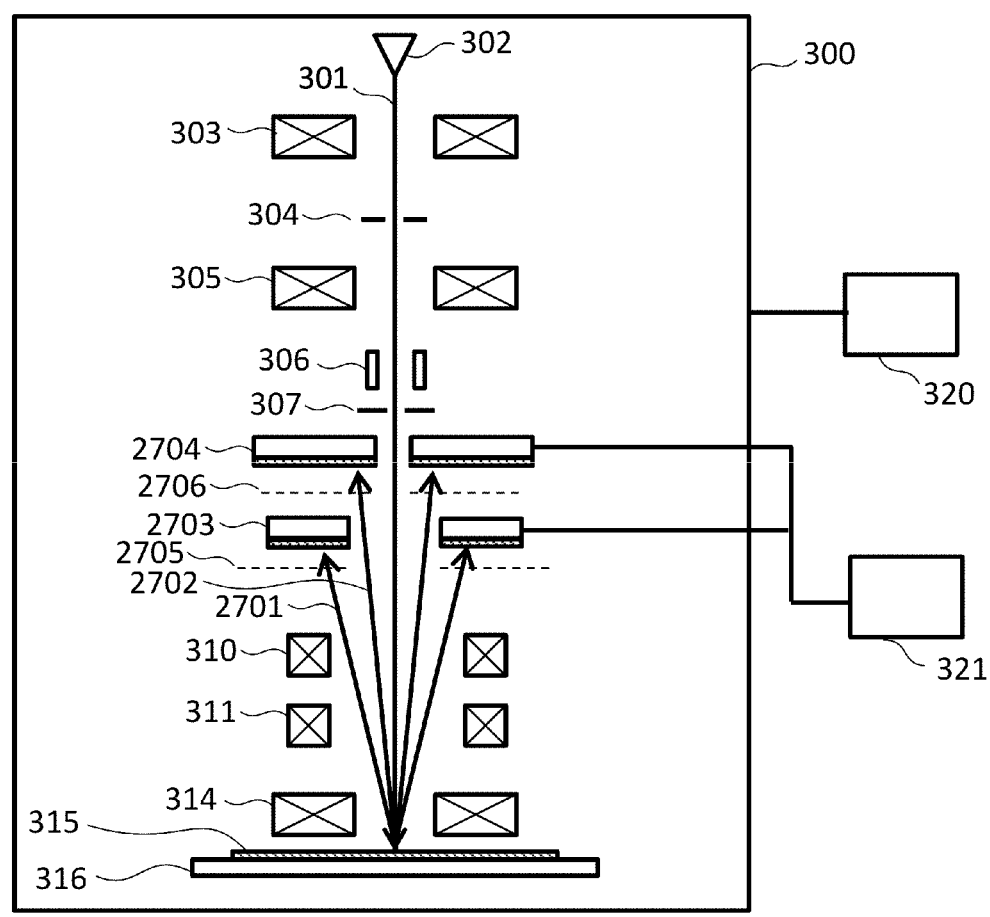
FIG. 27 is a diagram showing an example of the scanning electron microscope 300 according to a second embodiment.

FIG. 27 is a diagram showing an example of the scanning electron microscope 300 according to the second embodiment. All components other than a detector have the same structure as in FIG. 3. Similarly to FIG. 3, when the sample 315 is irradiated with the electron beam 301, secondary particles 2701 and 2702 (secondary electrons and backscattered electrons) are emitted. The secondary particles are detected by the annular lower detector 2703 and the annular upper detector 2704 that are provided on a trajectory of the secondary particles. An opening provided at a center of both detectors allows the electron beam 301 to pass through. In particular, by making the opening of the upper detector 2704 sufficiently small, it is possible to detect the secondary particles 2702 that are emitted from a bottom of a deep hole or a deep trench formed on the sample 315, pass through a vicinity of a center of a pattern, and escape onto a sample surface. The lower detector 2703 can detect the secondary particles 2701 emitted in a horizontal direction with respect to the upper detector 2704, and an SEM image more sensitive to a change in the shape of the surface can be obtained. Energy filtering using an energy filter 2705 immediately before the lower detector 2703 or an energy filter 2706 immediately before the upper detector 2704 enables energy discrimination of emitted electrons. The energy filter is generally formed of a grid-shaped electrode so that the secondary particles can pass through, and can apply a voltage. Secondary particles having energy higher than the voltage applied to the energy filter can pass through the energy filter and reach the detector. Secondary particles having energy lower than the voltage applied to the energy filter cannot pass through the energy filter, and thus cannot reach the detector. Therefore, by controlling the voltage applied to the energy filter, an effect of filtering components of the secondary particles to be detected can be attained.

The lower detector 2703 and the upper detector 2704 can be divided in a circumferential direction and handled as independent detectors. For example, when the lower detector is divided into four lower detectors, an SEM image having the same azimuthal property as that in the case in which four lower detectors are placed in FIG. 3 is obtained. Both the lower detector 2703 and the upper detector 2704 can be divided. It is expected that the SEM image having higher azimuthal property can be obtained by increasing the number of divisions of the lower detector 2703 and the upper detector 2704. The number of divisions may be changed for the lower detector 2703 and the upper detector 2704, or a division position (phase) in the circumferential direction may be changed.

Figure 28A:
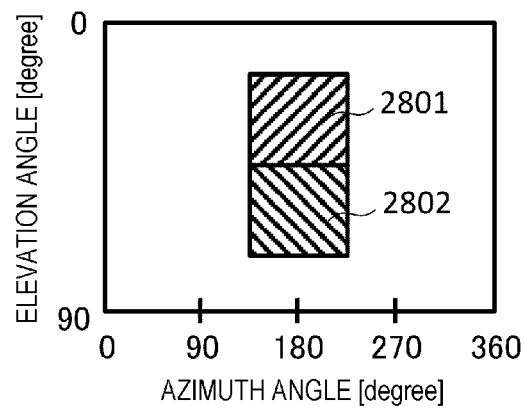
FIG. 28A shows an example of the detection acceptance of one detector when a lower detector 2703 and an upper detector 2704 in FIG. 27 are divided into four in a circumferential direction.
Figure 28B:
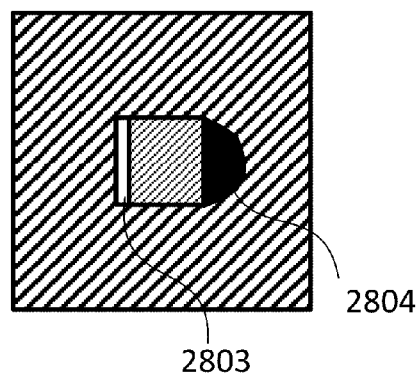
FIG. 28B shows an example of an SEM image obtained by a detector of detection acceptance 2801.
Figure 28C:
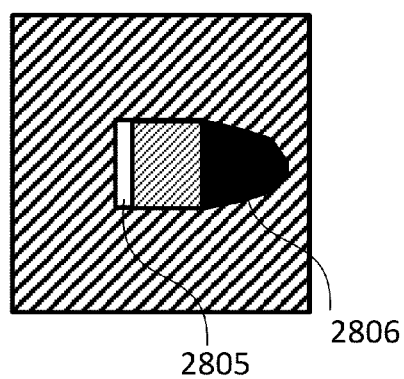
FIG. 28C shows an example of an SEM image obtained by a detector of detection acceptance 2802.

FIGS. 28A to 28C show examples of detection acceptance and SEM images when the lower detector 2703 and the upper detector 2704 in FIG. 27 are divided into four in the circumferential direction. The division of the detectors is performed in a left-right direction on a paper surface and in a paper-perpendicular direction. FIG. 28A shows an example of the detection acceptance of the upper and lower detectors divided on a left side of a paper. A region 2801 is an angular component in which the secondary particles are detected by the upper detector 2704, and a region 2802 is an angular component in which the secondary particles are detected by the lower detector 2703. For a dot pattern, the SEM image obtained using the upper detector 2704 is shown in FIG. 28B, and the SEM image obtained using the lower detector 2703 is shown in FIG. 28C. White bands 2803 and 2805 are narrower and weaker in the upper detector image (FIG. 28B) than in the lower detector image (FIG. 28C). Shadows 2804 and 2806 are observed longer in the lower detector image (FIG. 28C) than in the upper detector image (FIG. 28B). As described above, by obtaining a large number of SEM images of different detection acceptances for one shape, sensitivity to height change is improved, and estimation accuracy of the height map is improved.

Figure 29:
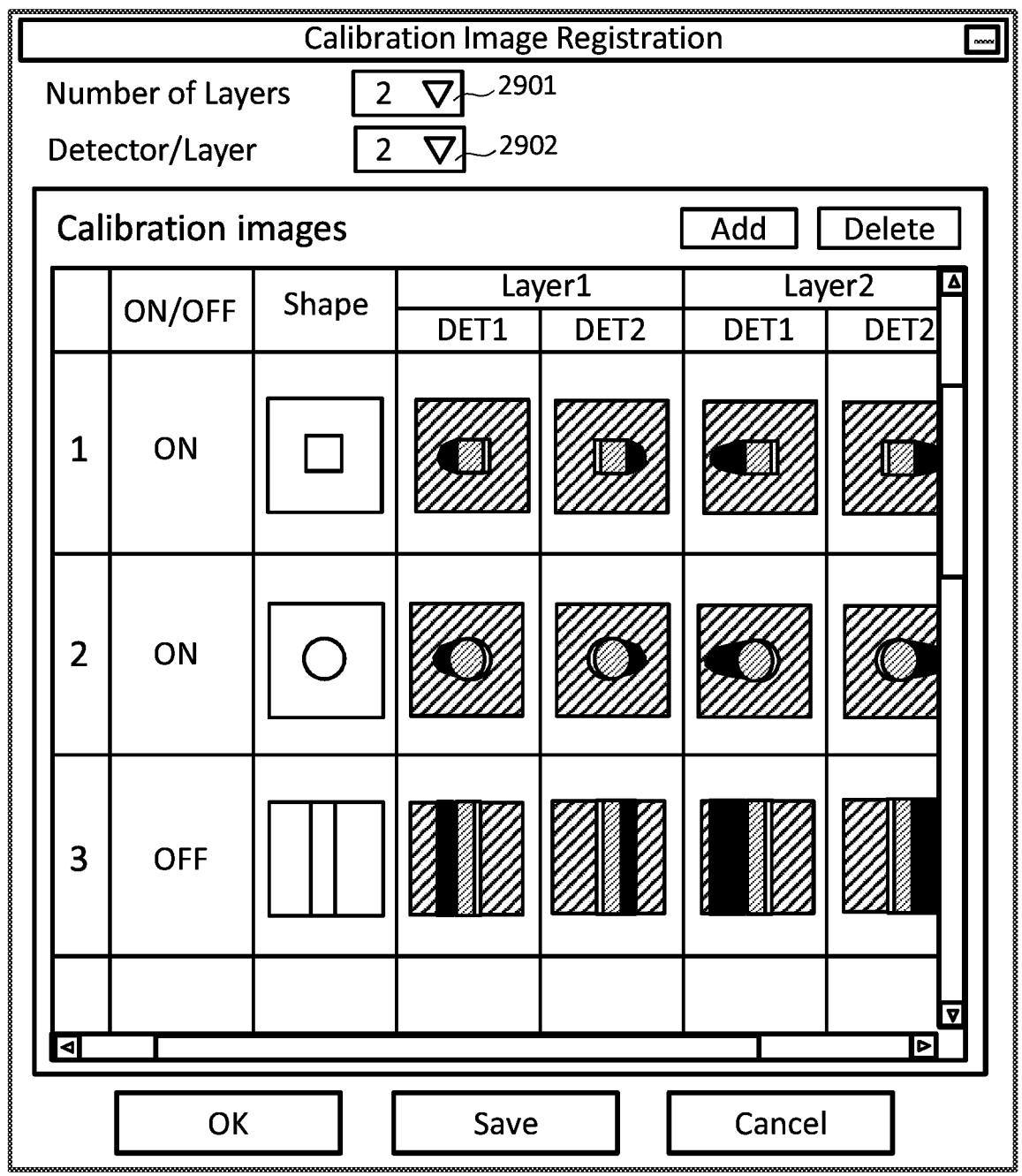
FIG. 29 shows an example of a GUI screen for registering shape data of the calibration pattern and the SEM image when the scanning electron microscope 300 according to the second embodiment is used.

FIG. 29 is an example of a GUI screen for registering shape data of the calibration pattern and the SEM image when the scanning electron microscope 300 according to the second embodiment is used. The entire configuration of the GUI screen is the same as that of the GUI screen in FIG. 10 for the scanning electron microscope in FIG. 3, and a setting method is also the same. The number of layers of the detector is inputted to a selection box 2901. Here, since two layers of the upper detector 2704 and the lower detector 2703 are formed, "2" is selected. Next, the number of detectors per layer is selected in a selection box 2902. In the drawing, "2" is selected on an assumption that the detector is divided into left and right parts. According to the settings, two registered SEM images on the lower side are registered in each of a layer 1 and a layer 2. In the present GUI screen, the selection boxes are created so that the number of detectors per layer is the same in all layers, whereas the GUI screen may be changed so that the number is selected in each layer.

Third Embodiment

In the first embodiment, data including a set of various shapes created by the calculation device 102 and the simulated SEM images corresponding to the shapes is set as training data. However, in a case in which the accuracy of the simulation or the analytical method is not sufficient when the simulated SEM image is created, a deviation from the actual measurement result occurs. Further, since the detection acceptance is estimated based on the SEM image of the calibration pattern, an error may occur from the detection acceptance of an actual device. Data assimilation can be mentioned as a method for solving such a problem. The data assimilation is a method of correcting an error in simulation by an actual measurement result. In a third embodiment of the disclosure, an example in which the data assimilation is used will be described. The configuration of the image processing system 100 is the same as that according to the first embodiment. Matters described in the first and second embodiments and not described in the third embodiment can also be applied to the third embodiment unless there are special circumstances.

Figure 30A:
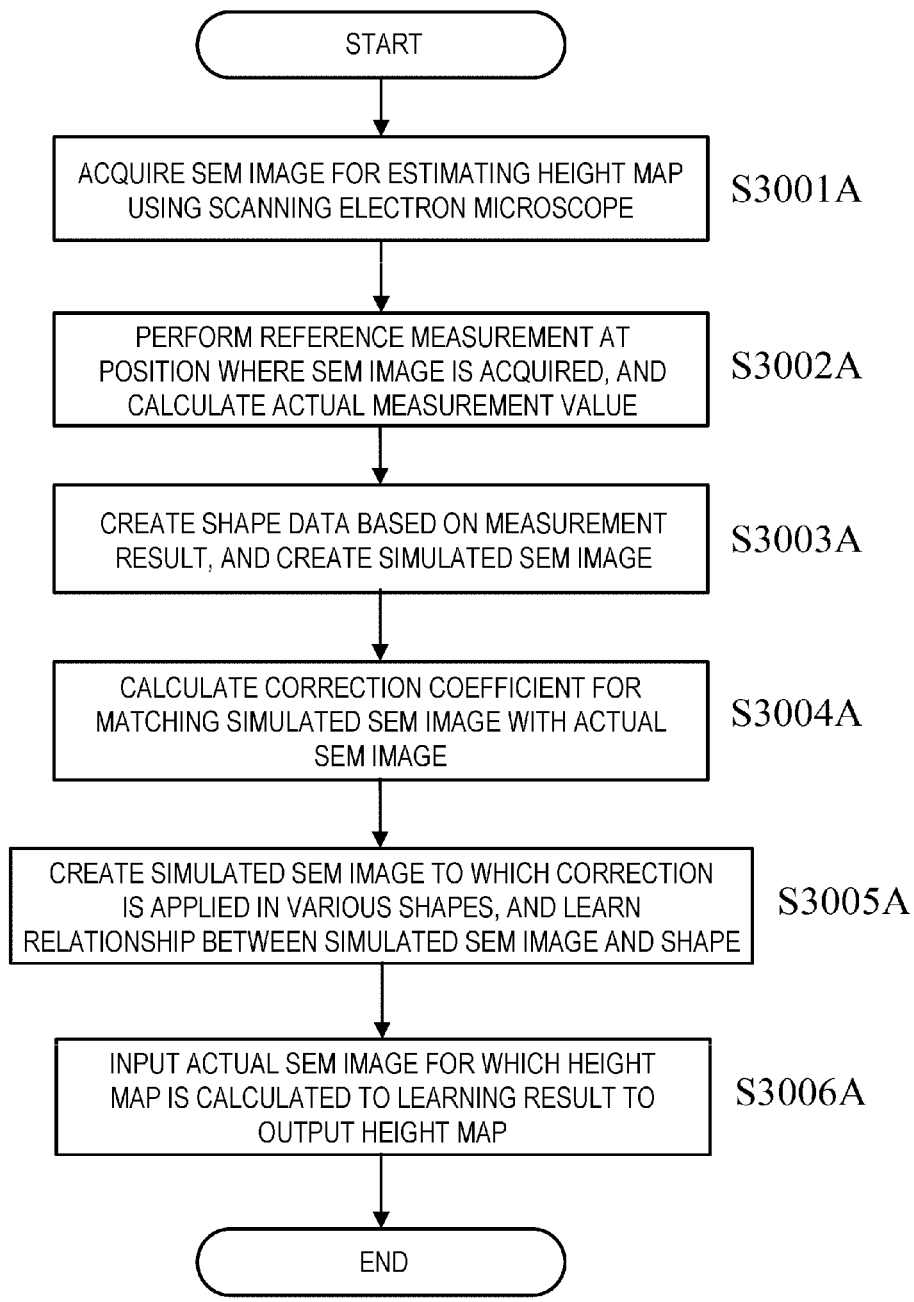
FIG. 30A shows an example of a flowchart of data assimilation performed by the image processing system 100 according to a third embodiment.

FIG. 30A shows an example of a flowchart of the data assimilation performed by the image processing system 100 according to the third embodiment. First, an SEM image for estimating a height map is acquired using a scanning electron microscope (S3001A). Next, reference measurement is performed using AFM, cross-section SEM, tilt SEM, and the like at a position where the SEM image is acquired (S3002A). At this time, a height map of a region covering the entire SEM image may be acquired. Alternatively, only a part of characteristic shape parameters (size) may be measured. The calculation device 102 creates shape data based on a result of the reference measurement, and creates a simulated SEM image (S3003A). The calculation device 102 compares the actual SEM image acquired in S3001A with the simulated SEM image created in S3003A, and calculates a correction coefficient for matching the simulated SEM image with the actual SEM image (S3004A). The correction coefficient includes adjustment of a gradation value or addition and subtraction of noise of the image, and may include other corrections. In order to improve accuracy of the correction coefficient, it is preferable to acquire a plurality of SEM images with shapes having different sizes as much as possible and to perform the reference measurement. Next, a simulated SEM image to which the correction is applied is created in various shapes of the measurement target, and a relationship between the simulated SEM image and the shape is learned (S3005A). Finally, an actual SEM image (different from S3001A) for which the height map is calculated is inputted to the learning result and the height map is output (S3006A).

In FIG. 30A, since the correction coefficient is calculated so as to bring the simulated SEM image close to the actual SEM image, even when the learner 103 learns various simulated SEM images generated by the calculation device 102, the relationship between the image obtained by applying the correction coefficient to the simulated SEM image and an original shape pattern for generating the simulated SEM image is learned. In other words, the learner 103 accumulates the learning result close to the actual SEM image. Therefore, when an estimation result is obtained from the learner 103, the SEM image of the measurement target may be inputted to the learner 103 without modification. This is because the learner 103 has already learned a group of images that are close to the actual SEM image.

Figure 30B:
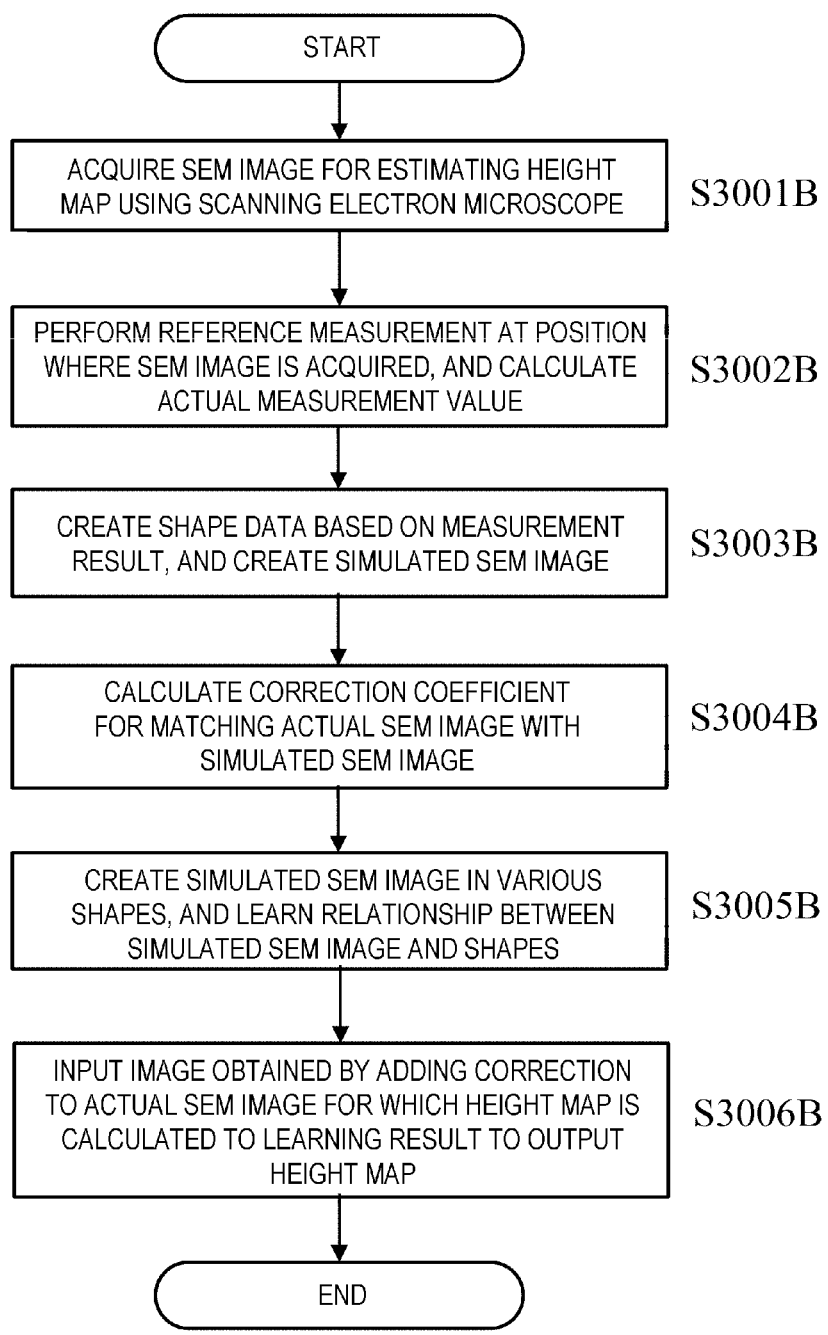
FIG. 30B shows an example of the flowchart of the data assimilation performed by the image processing system 100 according to the third embodiment.

FIG. 30B shows another example of the flowchart of the data assimilation performed by the image processing system 100 according to the third embodiment. In the flowchart in FIG. 30A, the correction coefficient is calculated so that the simulated SEM matches the actual SEM, learning is performed using the corrected simulated SEM image, and the actual SEM image is input to the learning result, thereby improving the height map calculation accuracy. In FIG. 30B, on the contrary, the correction coefficient is calculated so that the actual SEM image matches the simulated SEM image.

First, an SEM image for estimating a height map is acquired using a scanning electron microscope (S3001B). Next, reference measurement is performed using AFM, cross-section SEM, tilt SEM, and the like at the position where the SEM image is acquired (S3002B). At this time, a height map of a region covering the entire SEM image may be acquired. Alternatively, only a part of characteristic shape parameters (size) may be measured. The calculation device 102 creates shape data based on a result of the reference measurement, and creates a simulated SEM image (S3003B). The calculation device 102 compares the actual SEM image acquired in S3001B with the simulated SEM image created in S3003B, and calculates the correction coefficient for matching the actual SEM image with the simulated SEM image (S3004B). The correction coefficient includes adjustment of a gradation value and addition and subtraction of noise of the image, and other corrections may be employed. In order to improve the accuracy of the correction coefficient, it is preferable to acquire a plurality of SEM images with shapes having different sizes as much as possible and to perform the reference measurement. Next, simulated SEM images are created in various shapes of the measurement target, and the relationship between the simulated SEM images and the shapes is learned (S3005B). Finally, the height map is outputted by inputting, into the learning result, the SEM image obtained by adding the correction to the actual SEM image for which the height map is calculated (S3006B).

In FIG. 30B, since the correction coefficient is calculated so as to bring the actual SEM image close to the simulated SEM image, a content to be learned is the relationship between the simulated SEM image and an original shape pattern for generating the simulated SEM image. Thereafter, when the estimation result is obtained from the learner 103, a corrected image close to the simulated SEM image may be acquired by applying the correction coefficient to the SEM image of the measurement target, and the corrected image may be inputted to the learner 103.

A difference in detection characteristics among a plurality of detectors may be another factor causing the error between the simulation and the actual measurement. Since the plurality of detectors are arranged symmetrically with respect to the optical axis, the number of secondary particles (signal amount) reaching the detector is expected to be the same, and the gradation value of the obtained SEM image also is expected to be the same. However, signal processing is performed through an electric circuit until the SEM image is created from the detector. There is an individual difference of an analog-digital (A/D) conversion element or the like used at that time, or a device difference due to an assembly error or the like even in a device having the same configuration, and the gradation values of the SEM images that are expected to be the same are often different in each detector. Therefore, it is necessary to perform correction so that the same gradation value is obtained when the same signal amount is obtained in all the detectors.

Figure 31:
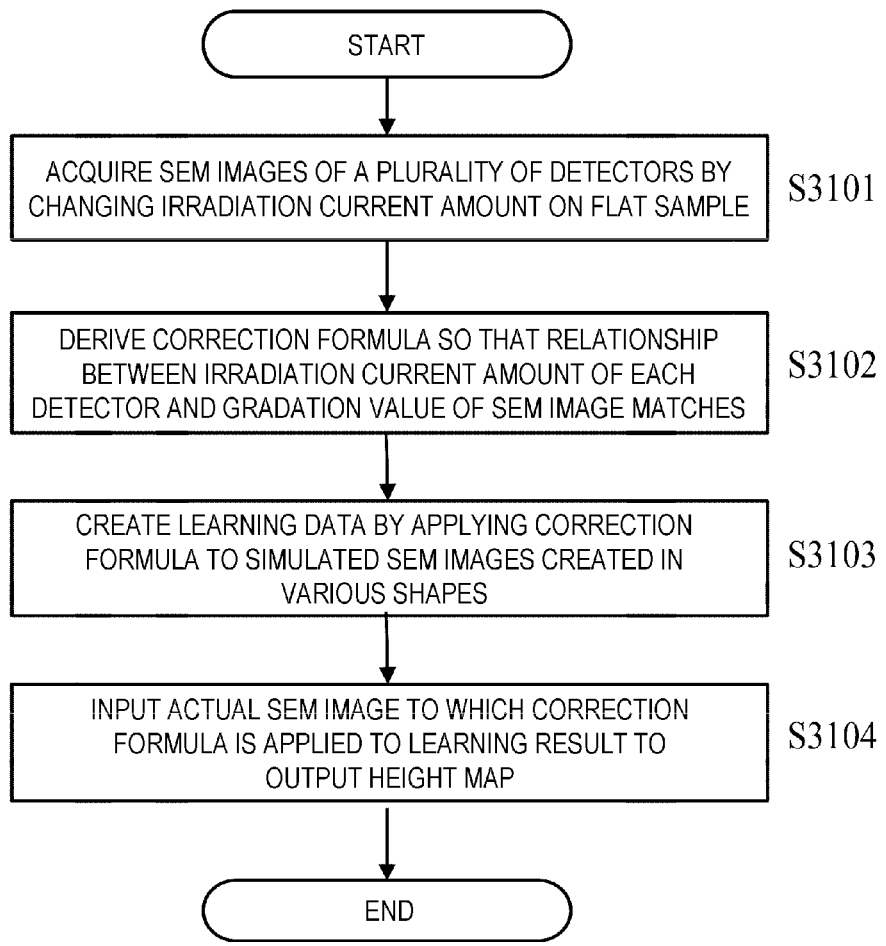
FIG. 31 is an example of another flowchart of the data assimilation.

FIG. 31 shows an example of another flowchart of the data assimilation. First, SEM images of a plurality of detectors are acquired by changing an irradiation probe current on a flat sample (S3101). Next, a correction formula is calculated for each detector so that a relationship between the irradiation probe current and the gradation value of the SEM image matches (S3102). Learning data is created using the simulated SEM images created in various shapes (S3103). At this time, the correction formula may be applied to the simulated SEM image. Finally, the actual SEM image to which the correction formula is applied is inputted to the learning result, and the height map is outputted (S3104). By reducing the difference among the plurality of detectors and the difference among the devices in this way, the learning result becomes robust.

Figure 32:
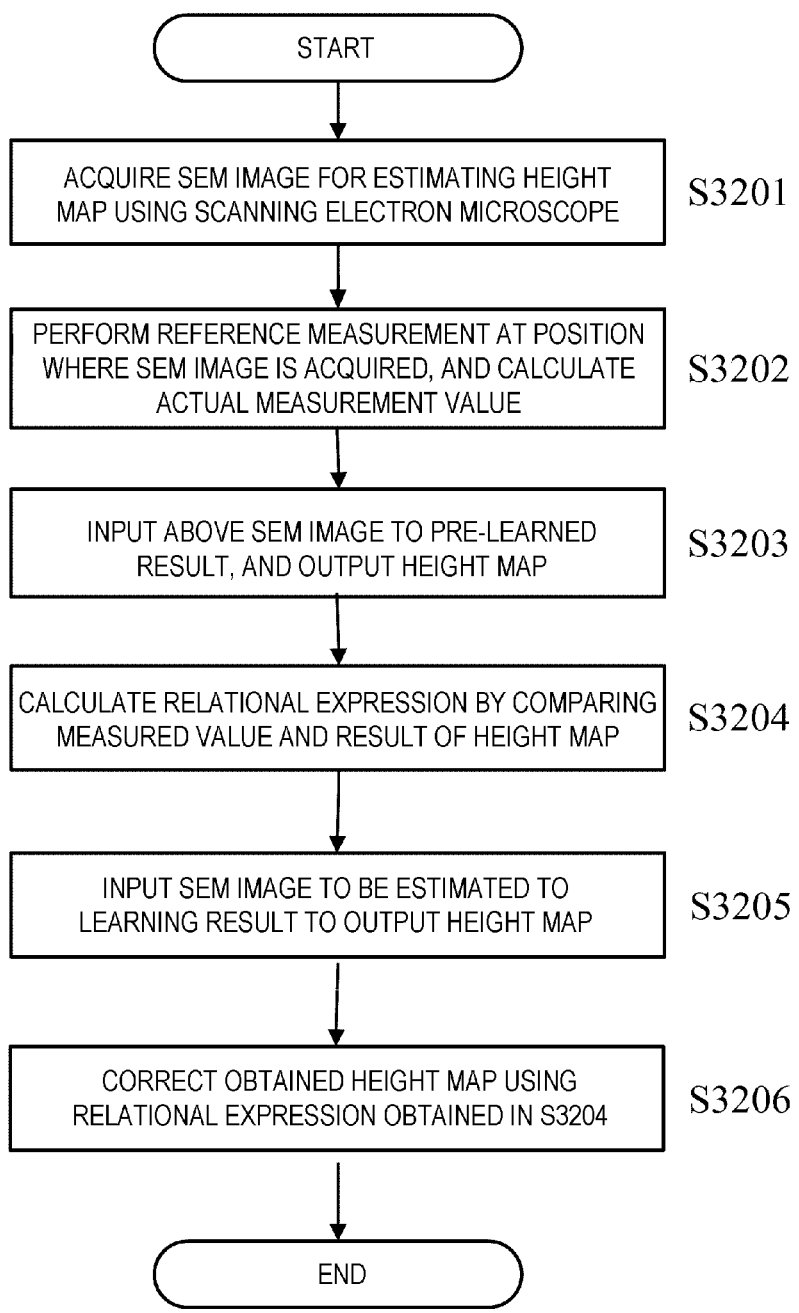
FIG. 32 is an example of a flowchart in which an error between a learning result and an actual measurement is corrected after an actual SEM image is input to the learning result and a height map is calculated.

FIG. 32 shows an example of a flowchart for correcting the error between the learning result and the actual measurement after the actual SEM image is inputted to the learning result to calculate the height map. First, an SEM image for estimating a height map is acquired using a scanning electron microscope (S3201). Next, reference measurement is performed using AFM, cross-section SEM, tilt SEM, and the like at the position where the SEM image is acquired (S3202). At this time, a height map of a region covering the entire SEM image may be acquired. Alternatively, only a part of characteristic shape parameters (size) may be measured. Thereafter, the SEM image used in S3201 is inputted to a result learned in advance, and a height map is output (S3203). An actual measurement value calculated in S3202 is compared with the height map outputted in S3203 to calculate two relational expressions (S3204). In order to improve the accuracy of the relational expression, it is preferable to acquire a plurality of SEM images with shapes having different sizes as much as possible and to perform the reference measurement. The SEM image to be estimated is inputted to the learning result and the height map is output (S3205), and the obtained height map is corrected using the relational expression obtained in S3204. Accordingly, the height map in which the error of the simulation is corrected is obtained. As described above, by using the flowchart in FIG. 32, it is possible to calibrate an absolute value by the actual measurement data while maintaining the sensitivity to the shape change caused by the simulation, and it is possible to obtain the height map with high accuracy.

In FIG. 30B, a correction that matches the simulated SEM image is added to the actual SEM image, and then the actual SEM image is inputted to the learner 103 (S3006B). In this case, when the correction coefficient is not calculated properly, the error from the actual measurement may increase. Therefore, as shown in the present flowchart, it is more likely that the height accuracy can be attained using a relational expression to approach the measured value later. In addition, when the present image processing system is used by a plurality of devices, cost is lower when the learning results are shared than when the learning results are created by each device. By comparing the actual measurement value with the height map in each device and by calculating and utilizing the relational expression unique to each device, it is possible to perform device difference matching. In this case, since a common result can be used for the reference measurement, it is possible to check the difference among the devices by acquiring the SEM image at the same location in advance in each device.

In the third embodiment, four methods in FIGS. 30A, 30B, 31, and 32 are described in order to reduce the error at the time of calculating the height map. However, the methods may be performed individually or in combination. For example, different flowcharts can be used for each position on the sample.

Fourth Embodiment

Generally, in machine learning, it is said that accuracy of a learning result may be improved when the number of data sets used at a time of learning is large. However, the number of data sets that can be actually used for learning is limited. In order to effectively proceed learning even in such a limited data set, data augmentation is performed. The data augmentation is a technique of increasing a data amount by converting original learning data. It is known that the data augmentation exerts an effect on training of a convolutional neural network in a field of image processing. As a method of converting an image, noise amplification, noise removal, contrast adjustment, trimming, inversion (left-right/upper-lower), rotation, shift (horizontal/vertical) enlargement and reduction, and the like are generally used. Therefore, in the fourth embodiment according to the disclosure, the rotation and the trimming will be described as an example of the data augmentation. The configuration of the image processing system 100 is the same as that according to the first embodiment. Matters described in the first to third embodiments and not described in the fourth embodiment can also be applied to the fourth embodiment unless there are special circumstances.

Figure 33A:
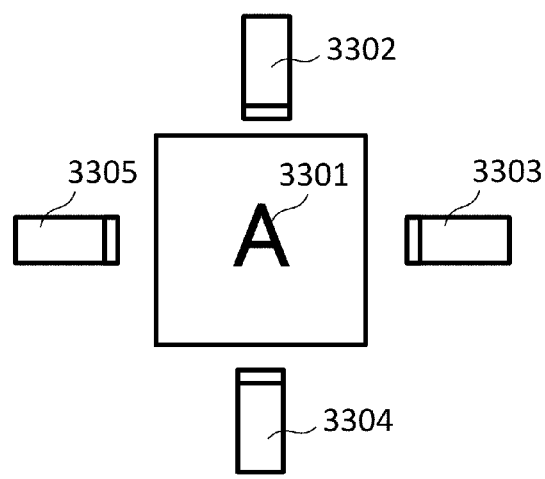
FIG. 33A shows a relationship between arrangements of a sample and a detector when a pattern 3301 is observed by four-direction detectors 3302, 3303, 3304, and 3305.
Figure 33B:
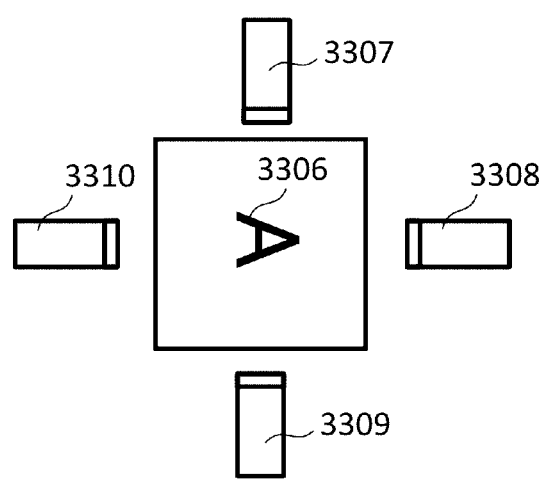
FIG. 33B shows a relationship between arrangements of a sample and a detector when a pattern 3306 obtained by rotating the pattern 3301 clockwise by 90° is observed by four-direction detectors 3307, 3308, 3309, and 3310.

FIGS. 33A and 33B show a relationship between the arrangement of a sample and a detector when the pattern 3301 is observed by four-directional detectors 3302, 3303, 3304, and 3305. The pattern 3301 is a character "A". In the detector 3302, a shadow is generated on a lower side of the pattern 3301, and the shadow is similarly seen on an opposite side of the detector. When the pattern and the detector are rotated clockwise by 90°, the image obtained by the detector 3302 in FIG. 33A is read again by a detector 3308 of a new arrangement in FIG. 33B. Similarly, 3303 is read again by 3309, 3304 is read again by 3310, and 3305 is read again by 3307. The original arrangement is restored when this operation is repeated four times. Therefore, with the four-direction detector, it is possible to increase the number of sets of data sets by four times.

Figure 33C:
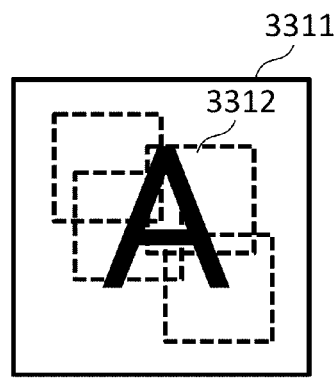
FIG. 33C shows an example of trimming.

FIG. 33C shows an example of the trimming By the trimming, it is possible to create a large number of images based on one image by cutting out a size 3312, which is smaller than a size 3311 of the SEM image, at random positions in the SEM image. Since the learning is performed on a size smaller than the original image size, when the height map is calculated based on the actual SEM image, height maps of a plurality of small size regions are outputted.

Figure 33D:
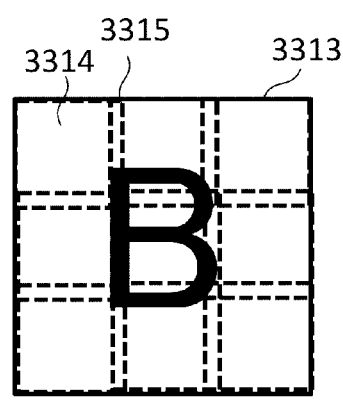
FIG. 33D shows an example in which one large height map 3313 is created by superimposing a plurality of small size region height maps 3314.

FIG. 33D shows an example in which one large height map 3313 is created by superimposing a plurality of small size region height maps 3314. At this time, when the height maps are arranged in a tile shape, the height at a boundary may become discontinuous. Therefore, a boundary portion can be made smooth by superimposing and averaging portions 3315 at an end or mixing the portions at a ratio from the end. When the trimming is used in this manner, a large number of images can be created based on one image, and the number of data sets used for learning can be significantly increased. When the trimming is used, the height map can be created without matching the image size for the SEM image of any size.

In the fourth embodiment, the rotation and the trimming are described as examples of the data augmentation, whereas the data number may be increased using another data augmentation method.

Fifth Embodiment

When an SEM image is acquired using a scanning electron microscope, in general, an additional file in which conditions for acquiring an image are described is stored together with the SEM image. The additional file roughly includes items related to the device itself, items related to optical conditions, and items related to image acquisition conditions. The items related to the device itself include, for example, a device manufacturer name and a device model number. The items related to the optical conditions include, for example, irradiation energy, an irradiation probe current, an electrode voltage in the device, and a current amount of a focusing lens. These conditions can also be stored as information collected as an optical mode. Finally, the items related to the image acquisition conditions include, for example, a name of the detector that acquires the image, a magnification, the number of frames, the number of pixels of the SEM image, and a gradation value correction method of the SEM image. In a fifth embodiment according to the disclosure, an example will be described in which, in addition to a relationship between the shape pattern and the image, a relationship between these and additional information is learned. Matters described in the first to fourth embodiments and not described in the present embodiment can also be applied to the present embodiment unless there are special circumstances.

Figure 34:
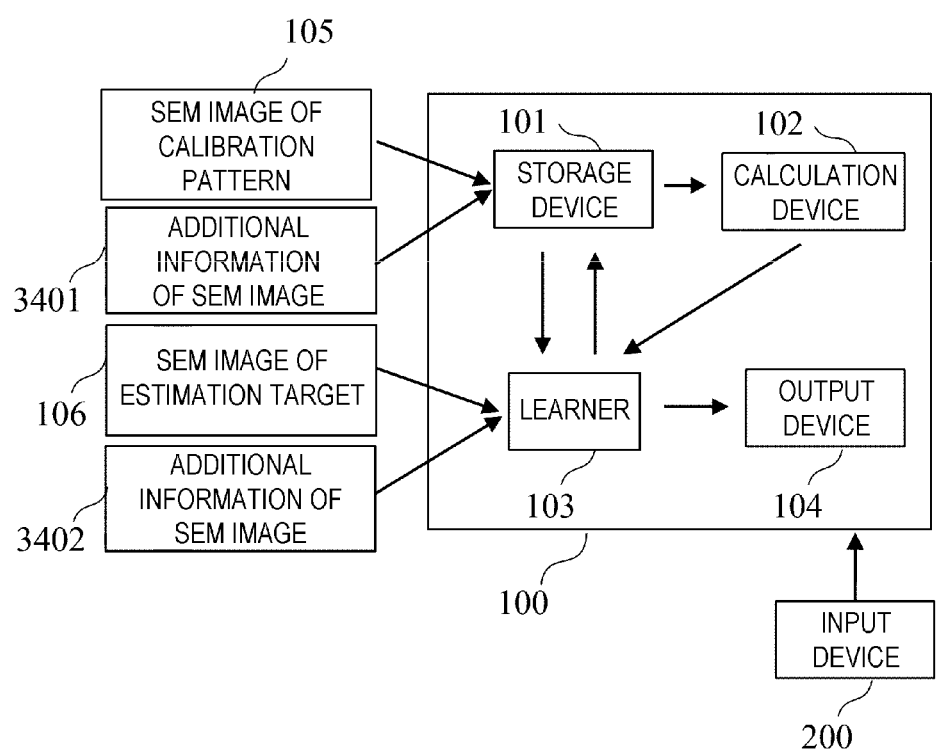
FIG. 34 is a configuration diagram showing the image processing system 100 according to a fifth embodiment.

FIG. 34 is a configuration diagram of the image processing system 100 according to the fifth embodiment. As in FIG. 1, the image processing system 100 includes the storage device 101, the calculation device 102, the learner 103, the output device 104, and the input device 200. A difference from FIG. 1 is that not only the SEM image 105 of the calibration pattern but also additional information 3401 of the SEM image is stored in the storage device 101. Furthermore, not only the SEM image 106 of the estimation target for the learner 103 but also additional information 3402 of the SEM image is inputted to the learner 103. In this manner, by adding the additional information, for example, when an optical condition or a detector name for acquiring the SEM image is different between at a time of learning and at a time of estimation based on the learning result, it is possible to issue an error and notify the user of the error. Correction can be added when setting parameters at a time of SEM image acquisition are different.

The irradiation probe current, the magnification, and the number of frames affect noise of the SEM image. When a noise amount of the simulated SEM image used at the time of learning is different from a noise amount of the SEM image for estimating the height map, an error occurs at the time of estimating the height map. In gradation value correction of the SEM image, for example, when the SEM image is displayed in a gray scale of 256 gradations, the SEM image is formed by linearly associating a detection signal amount from 0 to 255 gradation values, or, for example, the SEM image is formed by applying a specific weight such that a portion having a small signal amount or a portion having a large signal amount is emphasized as in gamma correction. Alternatively, the gradation value may be adjusted to fall within a range of a specific gradation value, an adjustment may be performed such that several % above and several % below the signal amount fall within a specific gradation value range, or the like. According to the technique of the disclosure, since the height map is estimated using the gradation value information of the SEM image, a gradation value correction method of the SEM image is important information.

Although it is described above that the SEM image is corrected when the SEM image 106 for estimating the height map is inputted into the learner 103, for example, the information of the image noise amount or the gradation value correction method may be read using the SEM image 106 or the additional information 3402 acquired in advance for correction, and may be used as a creation condition when the calculation device 102 creates the simulated SEM image.

Sixth Embodiment

Since detection acceptance is information unique to a scanning electron microscope device and is not generally disclosed to a user, the user cannot directly know the detection acceptance. Therefore, in order for the user to create a simulated SEM image by himself/herself and to reproduce the SEM image acquired using the scanning electron microscope, it is necessary to investigate the detection acceptance without detailed information. In the first embodiment, the SEM image of the calibration pattern is stored in the storage device 101, the detection acceptance is estimated by performing calculation by the calculation device 102, and the simulated SEM image is created. That is, it is not necessary for the user to search for the detection acceptance by himself/herself.

However, since a manufacturer of the scanning electron microscope has the information of the detection acceptance, it is not necessary to estimate the detection acceptance based on the SEM image of a calibration pattern. If a step of estimating the detection acceptance is included, it becomes a factor of an error. Therefore, it is highly possible that accuracy is improved if the detection acceptance can be directly input. Therefore, in a sixth embodiment according to the disclosure, an example in which data describing the detection acceptance is used instead of the SEM image 105 of the calibration pattern will be described. Matters described in the first to fifth embodiments and not described in the present embodiment can also be applied to the present embodiment unless there are special circumstances.

Figure 35:
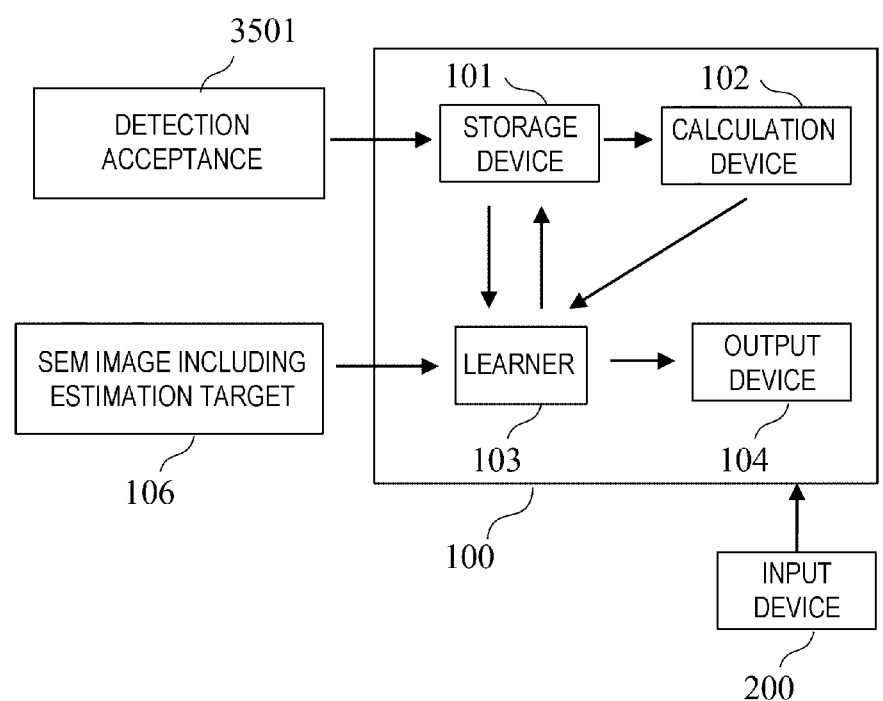
FIG. 35 is a configuration diagram showing the image processing system 100 according to a sixth embodiment.

FIG. 35 is a configuration diagram showing the image processing system 100 according to the sixth embodiment. As in FIG. 1, the image processing system 100 includes the storage device 101, the calculation device 102, the learner 103, the output device 104, and the input device 200. A difference from FIG. 1 is that a detection acceptance 3501 is inputted to the storage device 101 instead of the SEM image 105 of the calibration pattern.

Figure 36:
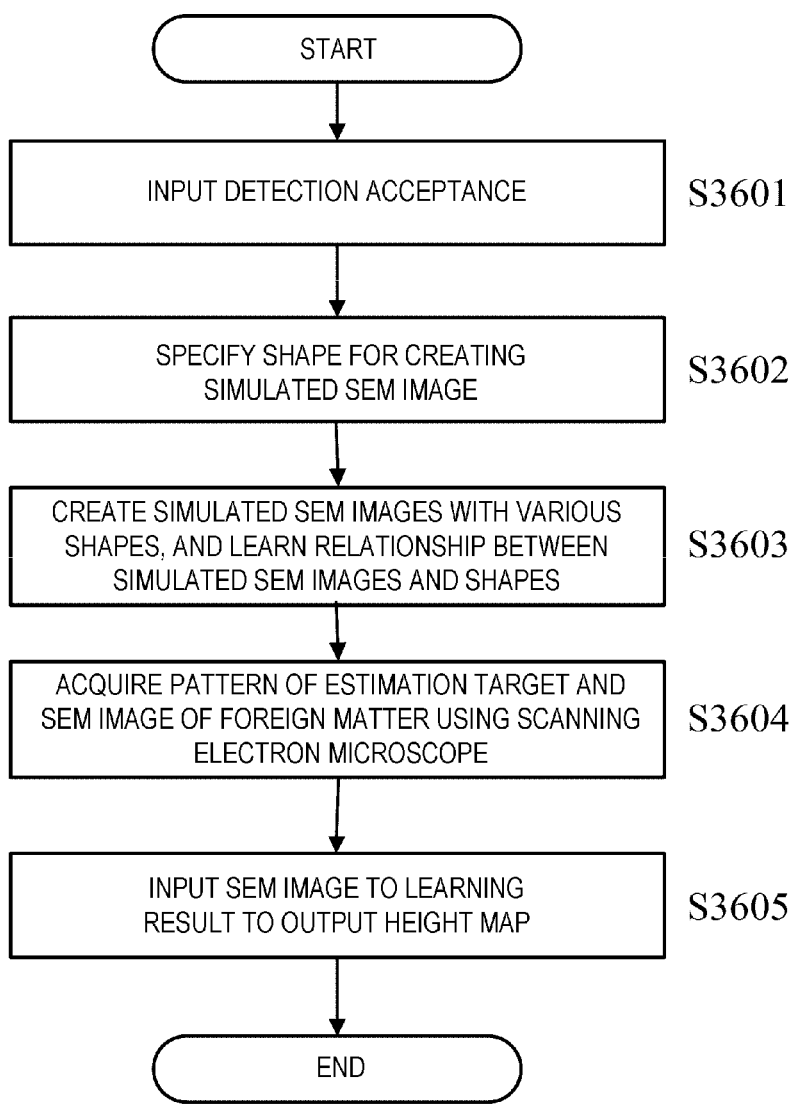
FIG. 36 is a flowchart showing a procedure in which the image processing system 100 according to the sixth embodiment estimates a height map.

FIG. 36 is a flowchart showing a procedure of the image processing system 100 according to the sixth embodiment estimating the height map. The detection acceptance 3501 is inputted to the storage device 101 (S3601), a shape for creating the simulated SEM image is specified (S3602), the simulated SEM images are created in various shapes, a relationship between the simulated SEM images and the shapes is learned (S3603), the SEM image (106) of the estimation target is acquired using the scanning electron microscope (S3604), the SEM image acquired in S3604 is input to a result learned in 53403, and the height map is output (S3605).

FIG. 37 shows an example of inputting the detection acceptance in a text file. On an upper side in FIG. 37, the number of detectors, the irradiation energy, types (secondary electrons or backscattered electrons) of secondary particles, an energy step, an elevation angle step, and an azimuth angle step are specified. On a lower side in FIG. 37, a detection ratio of each detector at each piece of the energy, the elevation angle, and the azimuth angle is described. The detection ratio between values of the energy and the angle is obtained by interpolation. Although not shown in FIG. 37, information such as a device manufacturer name, a model number, an optical mode name, and an electrode voltage may be described in a text file.

Figure 38A:
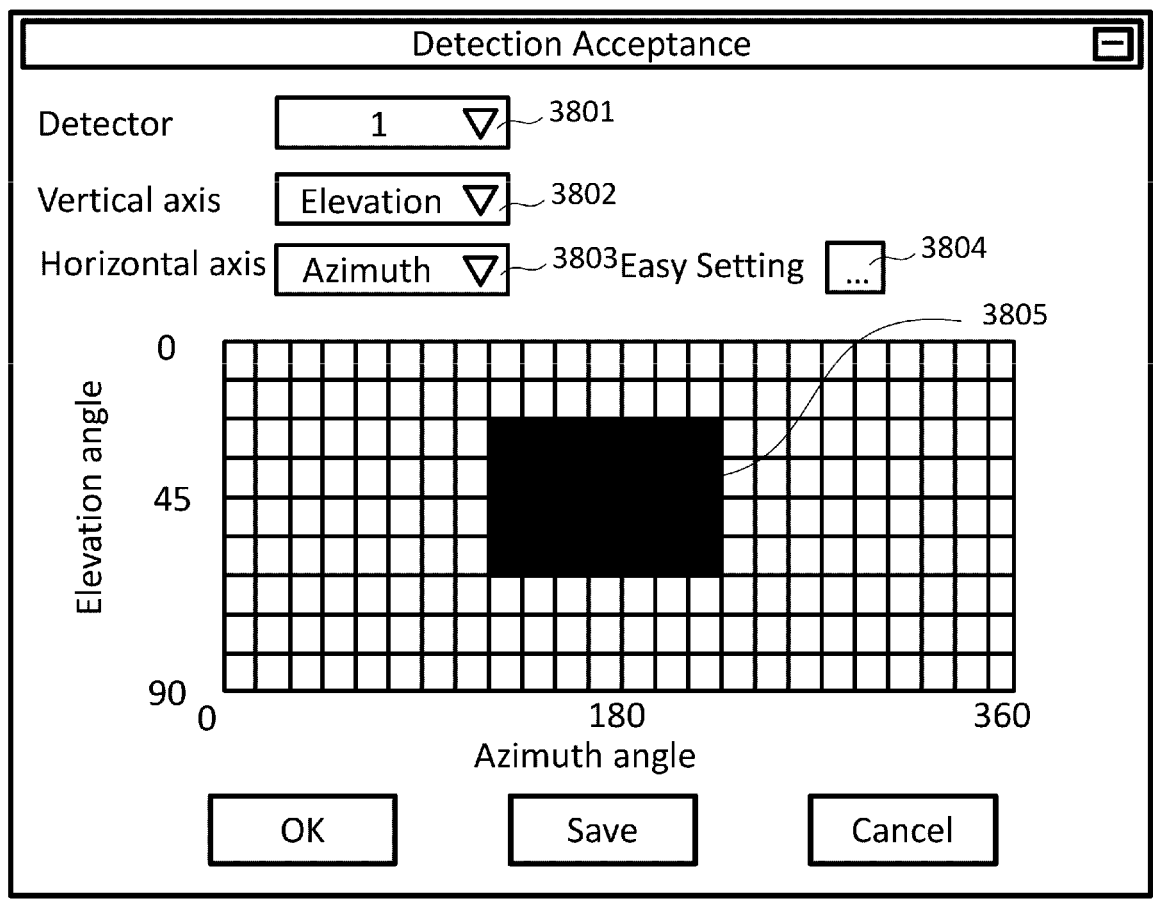
FIG. 38A shows an example of a GUI screen for inputting the detection acceptance.
Figure 38B:
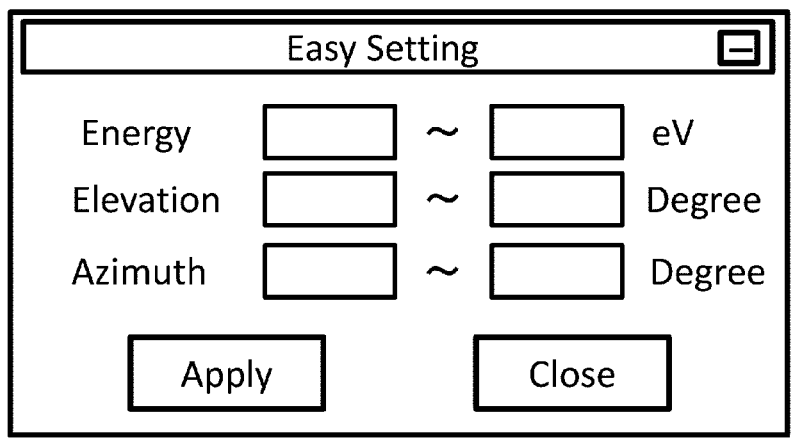
FIG. 38B shows an example of a GUI screen that is opened when a simple setting button 3804 is pressed.

In FIG. 37, the detection acceptance is inputted in a text format. However, the detection acceptance may be set on a GUI. FIGS. 38A and 38B show an example of a GUI screen for inputting the detection acceptance. A number of the detector to be set is selected in a selection box 3801, and a vertical axis and a horizontal axis are specified in selection boxes 3802 and 3803. Here, the vertical axis represents the elevation angle, and the horizontal axis represents the azimuth angle. When the settings are completed, a graph is described at the center of the GUI screen. When a cell of the graph is clicked, the cell changes to black or white. A black region 3805 is a region to be detected. However, when it is difficult to click all cells, an easy setting can be performed by pressing the button 3804. FIG. 38B shows an example of a GUI screen that is opened when the button 3804 is pressed. Here, when a range of the energy, the elevation angle, and the azimuth angle is input and an Apply button is pressed, the range is reflected in a black region (detected range) in FIG. 38A.

As described above, when the information of the detection acceptance is obtained, the height map can be outputted from the actual SEM image as in the first to fifth embodiments by directly storing the information in the storage device 101 instead of the SEM image of the calibration pattern.

Seventh Embodiment

In a seventh embodiment according to the disclosure, an example in which data describing a shape of a detector is used instead of the SEM image 105 of the calibration pattern will be described. Matters described in the first to sixth embodiments and not described in the present embodiment can also be applied to the present embodiment unless there are special circumstances.

Figure 39:
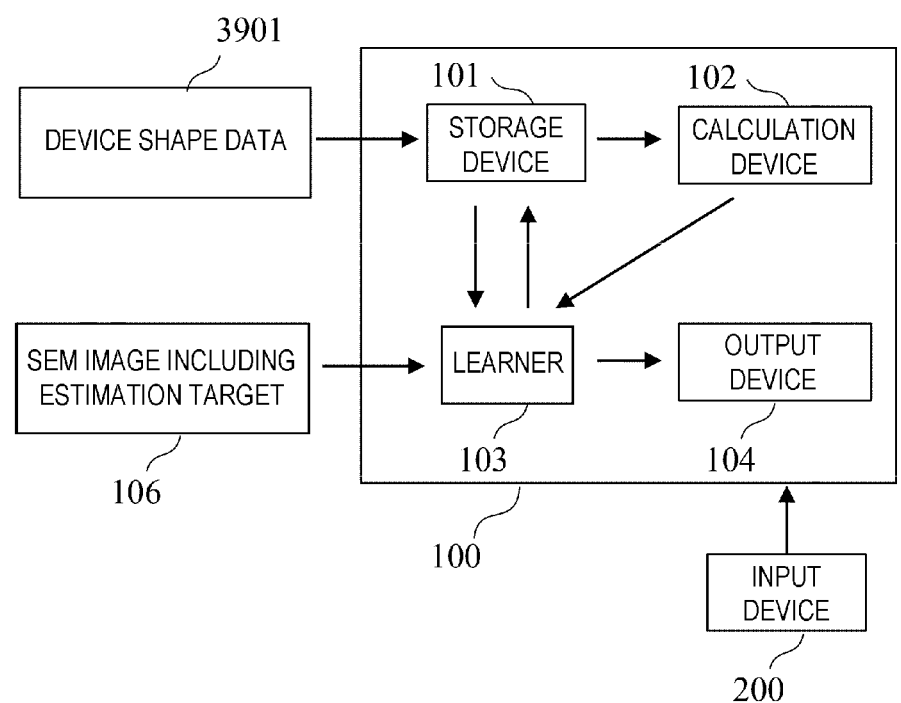
FIG. 39 is a configuration diagram showing the image processing system 100 according to a seventh embodiment.

FIG. 39 is a configuration diagram showing the image processing system 100 according to the seventh embodiment. As in FIG. 1 and FIG. 35, the image processing system 100 includes the storage device 101, the calculation device 102, the learner 103, the output device 104, and the input device 200. A difference from FIGS. 1 and 35 is that device shape data 3901 is inputted to the storage device 101 instead of the SEM image 105 of the calibration pattern and the detection acceptance 3501.

Figure 40:
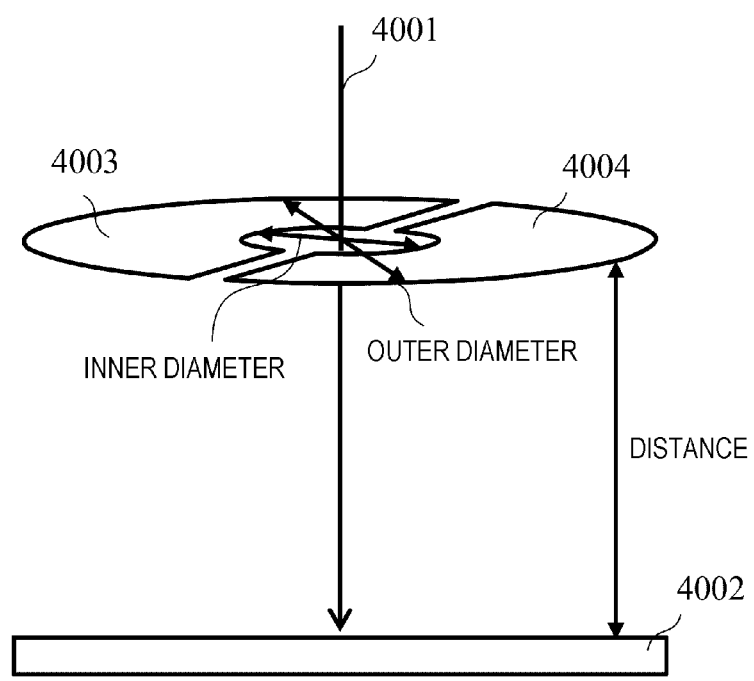
FIG. 40 shows an example of device shape data according to the seventh embodiment.

FIG. 40 shows an example of the device shape data according to the seventh embodiment. A sample 4002 is irradiated with an electron beam 4001 from above. In FIG. 40, the detector is assumed to be an annular detector, and is divided into a left detector 4003 and a right detector 4004. The device shape data in the present configuration includes a distance between the detectors 4003, 4004 and the sample 4002, an inner diameter and an outer diameter of the detector, and a division position. When the device shape data 3901 is stored in the storage device 101, the calculation device 102 calculates the detection acceptance according to the device shape data 3901. The detection acceptance may be calculated by calculating an angle of the secondary particles to be detected geometrically, or by using an existing electromagnetic field simulator. In FIG. 40, only the sample 4002 and the detectors 4003 and 4004 are inputted as the device shape data. However, other optical elements such as an objective lens and an electrode may be added.

As described above, by storing the device configuration in the storage device 101 instead of the SEM image of the calibration pattern or the detection acceptance, it is possible to output the height map from the actual SEM image as in the first to sixth embodiments.

MODIFICATION OF DISCLOSURE

The disclosure is not limited to the above embodiments, but includes various modifications. For example, the embodiments described above have been described in detail for easy understanding of the disclosure, and the disclosure is not necessarily limited to those including all the configurations described above. A part of a configuration according to an embodiment may be replaced with a configuration according to another embodiment, or a configuration according to an embodiment may be added to the configuration according to another embodiment. It is possible to add, delete, and replace other configurations for a part of the configurations of each embodiment.

In the sixth embodiment, it is described that the detection acceptance 3501 is stored in the storage device 101. However, the detection acceptance 3501 may be specified by the user via an interface such as a GUI. Similarly, in the seventh embodiment, the device shape data 3901 can be specified by the user via the interface.

In the above embodiment, the learner 103 can learn the relationship between the three-dimensional shape such as the height, the width, the length, the taper angle, the rounding, a width of the region, or the volume of the sample and the SEM image of the sample. Other appropriate three-dimensional shapes may be learned according to the shape of the sample.

In the embodiments described above, the calculation device 102 may be constituted by hardware such as a circuit device in which functions of the calculation device 102 are implemented, or may be constituted by a calculation device such as a general-purpose central processing unit (CPU) or a graphics processing unit (GPU) executing software in which the contents in each flowchart are implemented.

The learner 103 can be constituted by storing data describing a learning result in the storage device 101 and applying an input value to the learner 103 to the learning result data according to an internal structure of the learner 103. An algorithm used by the learner 103 to execute learning or estimation may be executed by the calculation device 102, or another calculation device may be provided for the learner 103.

In the embodiments described above, the scanning electron microscope, which is one of the charged particle beam devices, is described as an example, whereas the disclosure is also applicable to other charged particle beam devices such as an ion microscope.

What is claimed is:

1. An image processing system that estimates a three-dimensional shape of a sample based on a measurement image of the sample acquired by a charged particle beam device, the image processing system comprising:
    a storage unit that stores a detectable range of a detector detecting secondary particles generated from the sample when the charged particle beam device irradiates the sample with a charged particle beam;
    a calculation unit that outputs a simulated image obtained by simulating images of one or more three-dimensional shape patterns acquired by the charged particle beam device in accordance with the detectable range;
    a learner that learns a relationship between the one or more three-dimensional shape patterns and the simulated image; and
    an output unit that outputs a three-dimensional shape of the sample obtained from the learner by inputting the measurement image to the learner.

2. The image processing system according to claim 1, wherein
    the calculation unit is configured to estimate the detectable range using an image of a calibration pattern having a known three-dimensional shape,
    the image processing system further comprises an interface that allows the calibration pattern to be input,
    the interface is configured to select, as the calibration pattern, at least one of: any one of lists listing predetermined shape patterns; a shape parameter specifying the calibration pattern; or a shape pattern acquired by a measurement device different from the charged particle beam device; and
    the calculation unit estimates the detectable range using the image of the calibration pattern received by the interface.

3. The image processing system according to claim 1, wherein
    the storage unit stores a plurality of estimation images acquired by the charged particle beam device from one three-dimensional shape pattern by changing the detectable range, and
    the calculation unit estimates the detectable range when the charged particle beam device acquires the calibration pattern by comparing the image of the calibration pattern having the known three-dimensional shape acquired by the charged particle beam device with the plurality of estimation images, and stores a result of the estimation in the storage unit.

4. The image processing system according to claim 3, wherein
    the calculation unit creates the simulated image based on the estimated detectable range and energy and an angle of secondary particles emitted from the sample.

5. The image processing system according to claim 1, further comprising:
    an interface that allows the number of the simulated images to be input, wherein
    the calculation unit generates, as a temporary simulated image, the simulated images whose number is smaller than the number of the simulated images received by the interface, and
    the calculation unit calculates information indicating the temporary simulated image when a shape of the temporary simulated image is changed or a variation amount of the temporary simulated image when the shape of the temporary simulated image is changed, and presents a result of the calculation via the interface.

6. The image processing system according to claim 1, wherein
    the calculation unit is configured to estimate the detectable range using an image of a calibration pattern having a known three-dimensional shape,
    the image processing system further comprises an interface that allows the number of the simulated images to be input,
    the calculation unit generates, as a temporary simulated image, the simulated images whose number is smaller than the number of the simulated images received by the interface,
    the calculation unit calculates information indicating a variation amount of the temporary simulated image when a shape of the temporary simulated image is changed, and
    when the variation amount is less than a threshold value, the calculation unit re-calculates information indicating the variation amount for a new detectable range.

7. The image processing system according to claim 1, wherein
    the output unit includes an interface that presents the three-dimensional shape of the sample,
    the interface visually presents the three-dimensional shape of the sample, and
    the calculation unit calculates a distance between two points on the three-dimensional shape of the sample specified on the interface and presents the calculated distance on the interface.

8. The image processing system according to claim 1, wherein
    the calculation unit acquires a first image of the three-dimensional shape pattern of a correction sample acquired by the charged particle beam device,
    the calculation unit generates a second image of the three-dimensional shape pattern of the correction sample according to a height distribution of the correction sample acquired by a measurement device different from the charged particle beam device,
    the calculation unit calculates a correction coefficient for bringing the second image closer to the first image,
    the calculation unit applies a correction coefficient to the simulated image,
    the learner learns a relationship between the simulated image to which the correction coefficient is applied and the one or more three-dimensional shape patterns, and
    the output unit outputs the three-dimensional shape of the sample obtained from the learner by inputting the measurement image to the learner.

9. The image processing system according to claim 1, wherein
the calculation unit acquires a first image of the three-dimensional shape pattern of a correction sample acquired by the charged particle beam device,
the calculation unit generates a second image of the three-dimensional shape pattern of the correction sample according to a height distribution of the correction sample acquired by a measurement device different from the charged particle beam device,
the calculation unit calculates a correction coefficient for bringing the first image closer to the second image,
the learner learns a relationship between the simulated image and the one or more three-dimensional shape patterns,
the calculation unit acquires a corrected image by applying the correction coefficient to the measurement image, and
the output unit outputs the three-dimensional shape of the sample obtained from the learner by inputting the corrected image to the learner.

10. The image processing system according to claim 1, wherein
the charged particle beam device includes a plurality of the detectors,
the calculation unit acquires, for each of the detectors, an image of a flat surface when the charged particle beam device irradiates the flat surface of the sample with the charged particle beam,
the calculation unit calculates a correction coefficient of reducing a difference between images for each of the detectors,
the calculation unit generates the simulated image by applying the correction coefficient to the image acquired for each of the detectors,
the learner learns a relationship between the simulated image to which the correction coefficient is applied and the one or more three-dimensional shape patterns,
the calculation unit acquires a corrected image by applying the correction coefficient to the measurement image, and
the output unit outputs the three-dimensional shape of the sample obtained from the learner by inputting the corrected image to the learner.

11. The image processing system according to claim 1, wherein
the calculation unit generates, for the simulated image, an expanded simulated image obtained by transforming the simulated image by applying at least one of: noise amplification; noise removal; contrast adjustment; trimming; left-right reversal; upper-lower reversal; rotation; shift; enlargement; or shrink; and
the learner learns a relationship between the expanded simulated image and the one or more three-dimensional shape patterns in addition to a relationship between the simulated image and the one or more three-dimensional shape patterns.

12. The image processing system according to claim 1, wherein
the learner learns a relationship among the one or more three-dimensional shape patterns, the simulated image, and additional information describing a condition when the charged particle beam device acquires the simulated image, and
the output unit outputs the three-dimensional shape of the sample obtained from the learner by inputting the measurement image and the additional information describing the condition when the charged particle beam device acquires the measurement image into the learner.

13. The image processing system according to claim 1, wherein
the calculation unit receives data describing the detectable range or receives a value of the detectable range via an interface that allows the detectable range to be input, and
the calculation unit stores the received detectable range in the storage unit.

14. The image processing system according to claim 1, wherein
the calculation unit receives data describing a shape of the detector or receives the shape of the detector via an interface that allows the shape of the detector to be input, and
the calculation unit calculates the detectable range using the received shape of the detector and stores the calculated detectable range in the storage unit.

15. The image processing system according to claim 1, wherein
the learner outputs, as a learning result, at least one of: a height; a width; a length; a taper angle; rounding; a width of a region; or a volume of the sample, and
the output unit outputs at least one of: the height; the width; the length; the taper angle; the rounding; the width of the region; or the volume of the sample acquired from the learning result.

* * * * *